(12) United States Patent
Reisner et al.

(10) Patent No.: US 9,054,663 B2
(45) Date of Patent: Jun. 9, 2015

(54) APPARATUS AND METHODS FOR REDUCING CAPACITIVE LOADING OF A POWER AMPLIFIER SUPPLY CONTROL MODULE

(71) Applicant: SKYWORKS SOLUTIONS, INC., Woburn, MA (US)

(72) Inventors: Russ Alan Reisner, Newbury Park, CA (US); Daniel Lee Kaczman, Newbury Park, CA (US); Yu-Jui Lin, Glendale, CA (US); Andy Cheng Pang Wu, Camarillo, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/222,113

(22) Filed: Mar. 21, 2014

(65) Prior Publication Data
US 2014/0203878 A1 Jul. 24, 2014

Related U.S. Application Data

(63) Continuation of application No. 13/419,162, filed on Mar. 13, 2012, now Pat. No. 8,717,100.

(60) Provisional application No. 61/452,821, filed on Mar. 15, 2011.

(51) Int. Cl.
*H03G 3/20* (2006.01)
*H03F 1/02* (2006.01)
(Continued)

(52) U.S. Cl.
CPC ............. *H03G 3/20* (2013.01); *H03F 1/0222* (2013.01); *H03F 1/0227* (2013.01); *H03F 1/025* (2013.01);
(Continued)

(58) Field of Classification Search
USPC ...... 330/297, 136, 127, 134, 279, 295, 124 R
See application file for complete search history.

(56) References Cited

U.S. PATENT DOCUMENTS 5,264,752 A 11/1993 Savicki
6,157,253 A 12/2000 Sigmon et al.
(Continued)

FOREIGN PATENT DOCUMENTS

GB 2398648 8/2004
GB 2409115 11/2006
(Continued)

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.
(Continued)

*Primary Examiner* — Hieu Nguyen
(74) *Attorney, Agent, or Firm* — Knobbe Martens Olson & Bear LLP

(57) ABSTRACT

Apparatus and methods for reducing capacitive loading of a power amplifier supply control module are disclosed. In one embodiment, a method of power supply control in a power amplifier system includes controlling a voltage level of a supply voltage using a supply control module, amplifying a first radio frequency (RF) signal using a first power amplifier module, amplifying a second RF signal using a second power amplifier module, delivering the supply voltage to a first supply input of the first power amplifier module through a first resonant circuit, and delivering the supply voltage to a second supply input of the second power amplifier module through a second resonant circuit. The first resonant circuit includes a first inductor and a first capacitor electrically connected in parallel, and the second resonant circuit includes a second inductor and a second capacitor electrically connected in parallel.

19 Claims, 16 Drawing Sheets

(51) Int. Cl.
*H03F 1/56* (2006.01)
*H03F 3/189* (2006.01)
*H03F 3/24* (2006.01)
*H03F 3/72* (2006.01)

(52) U.S. Cl.
CPC .............. *H03F 1/0277* (2013.01); *H03F 1/56* (2013.01); *H03F 3/189* (2013.01); *H03F 3/24* (2013.01); *H03F 3/72* (2013.01); *H03F 2200/102* (2013.01); *H03F 2200/387* (2013.01); *H03F 2200/411* (2013.01); *H03F 2200/429* (2013.01); *H03F 2203/7209* (2013.01); *H03F 2203/7236* (2013.01)

(56) References Cited

U.S. PATENT DOCUMENTS

| | | | |
|---|---|---|---|
| 7,042,294 | B2 | 5/2006 | Goss |
| 7,199,652 | B2 | 4/2007 | Morimoto et al. |
| 7,415,286 | B2 * | 8/2008 | Behzad .................. 455/553.1 |
| 7,482,869 | B2 | 1/2009 | Wilson |
| 7,679,433 | B1 | 3/2010 | Li |
| 8,143,951 | B2 | 3/2012 | Smiley |
| 8,717,100 | B2 | 5/2014 | Reisner et al. |
| 2002/0030543 | A1 | 3/2002 | French et al. |
| 2003/0155978 | A1 | 8/2003 | Pehlke |
| 2003/0179048 | A1 | 9/2003 | Kolsrud et al. |
| 2006/0057980 | A1 | 3/2006 | Haque et al. |
| 2007/0210771 | A1 | 9/2007 | Wilson et al. |
| 2007/0249304 | A1 | 10/2007 | Snelgrove et al. |
| 2007/0273449 | A1 | 11/2007 | Wilson |
| 2007/0279019 | A1 | 12/2007 | Wilson |
| 2009/0128236 | A1 | 5/2009 | Wilson |
| 2009/0289720 | A1 | 11/2009 | Koji et al. |
| 2009/0302941 | A1 | 12/2009 | Wimpenny |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Huang et al. "A MASH Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009.

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

Search Report and Written Opinion of Oct. 19, 2012 for International Application No. PCT/US2012/028958. 11 pages.

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

* cited by examiner

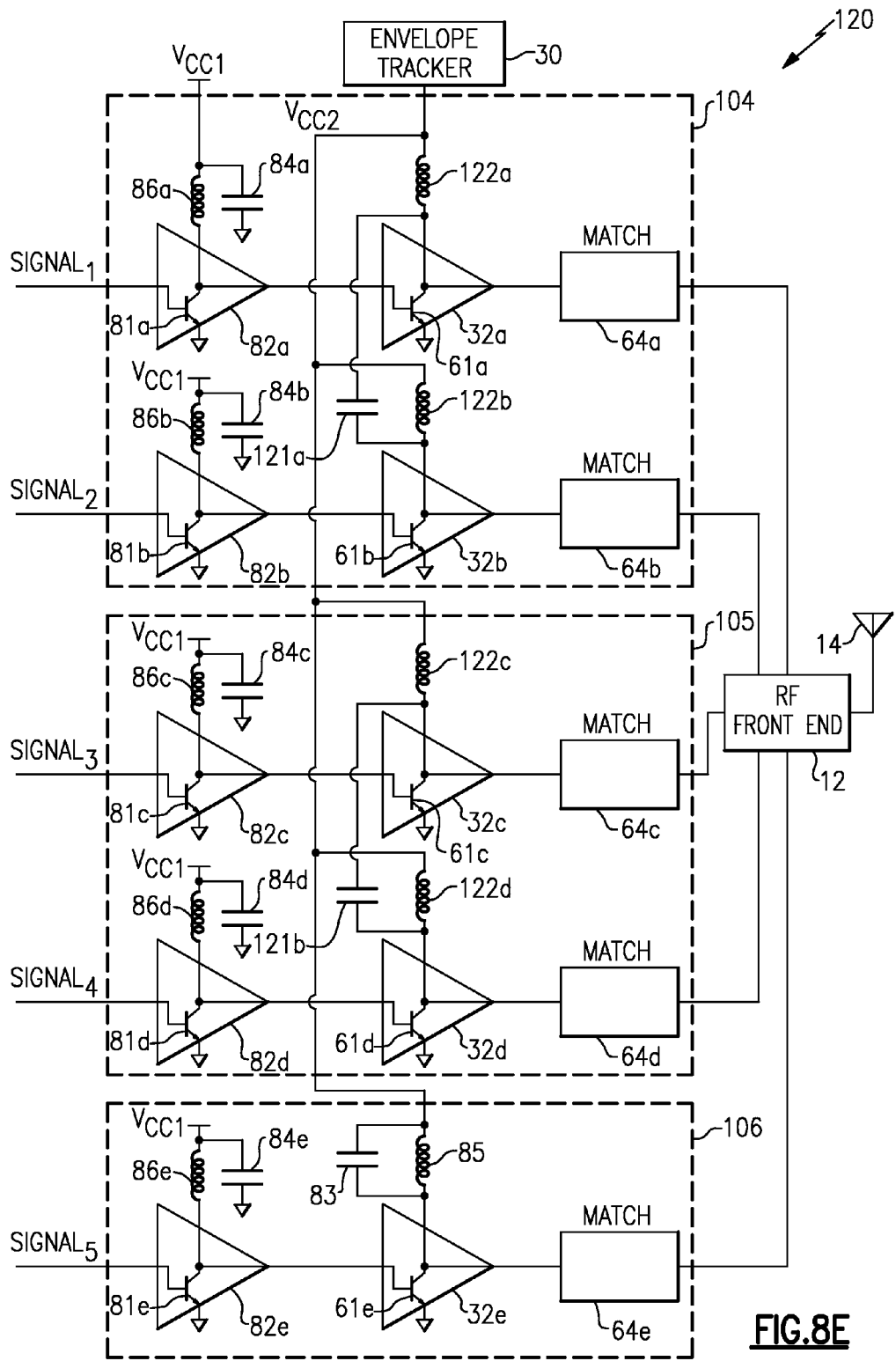

APPARATUS AND METHODS FOR REDUCING CAPACITIVE LOADING OF A POWER AMPLIFIER SUPPLY CONTROL MODULE

CROSS-REFERENCE TO RELATED APPLICATIONS

This application is a continuation of U.S. patent application Ser. No. 13/419,162, filed Mar. 13, 2012, entitled "APPARATUS AND METHODS FOR CAPACITIVE LOAD REDUCTION", which claims the benefit of priority under 35 U.S.C. §119(e) of U.S. Provisional Patent Application No. 61/452,821, filed Mar. 15, 2011 entitled "APPARATUS AND METHODS FOR CAPACITIVE LOAD REDUCTION", each of which are herein incorporated by reference in their entireties.

BACKGROUND

1. Field

Embodiments of the invention relate to electronic systems, and in particular, to radio frequency (RF) electronics.

2. Description of the Related Technology

RF power amplifiers can be used to boost the power of a RF signal having a relatively low power. Thereafter, the boosted RF signal can be used for a variety of purposes, included driving the antenna of a transmitter.

Power amplifiers can be included in mobile phones to amplify a RF signal for transmission. For example, in mobile phones having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal. It can be important manage the amplification of a RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

The power consumption of a power amplifier can be an important consideration. One technique for reducing power consumption of a power amplifier is envelope tracking, in which the voltage level of the power supply of the power amplifier is changed in relation to the envelope of the RF signal. For example, when the envelope of the RF signal increases the voltage level of the power amplifier's power supply can be increased. Likewise, when the envelope of the RF signal decreases the voltage level of the power amplifier's power supply can be decreased to reduce power consumption.

There is a need for improved power amplifiers. Furthermore, there is a need for reducing capacitance in power amplifier systems. Moreover there is a need for an envelope tracker having a reduced capacitive load.

SUMMARY

In certain embodiments, the present disclosure relates to a power amplifier system including a first power amplifier configured to amplify a first radio frequency (RF) signal of a first frequency, an envelope tracker configured to control a supply voltage of the first power amplifier using an envelope of the first RF signal, a first inductor electrically connected between the first power amplifier and the envelope tracker, and a first capacitor electrically connected between the first power amplifier and the envelope tracker. The first capacitor and the first inductor having a resonance near the first frequency.

In various embodiments, an impedance of the first capacitor and the first inductor is greater than about 200 Ω at the first frequency.

In a number of embodiments, the power amplifier system further includes a second power amplifier configured to amplify a second RF signal of a second frequency, the envelope tracker configured to control a supply voltage of the second power amplifier using an envelope of the second RF signal.

In certain embodiments, the power amplifier system further includes a second inductor electrically connected between the second power amplifier and the envelope tracker and a second capacitor electrically connected between the second power amplifier and the envelope tracker. The second capacitor and the second inductor having a resonance near the second frequency.

According to some embodiments, the power amplifier system further includes a second inductor having a first end electrically connected to the envelope tracker and a second end electrically connected to a first end of the first capacitor and to a supply node of the second power amplifier, the first capacitor including a second end electrically connected to a supply node of the first power amplifier.

In a number of embodiments, the second inductor and the first capacitor are configured to resonate near the second frequency such that the impedance of the second inductor and the first capacitor is greater at the second frequency than at a frequency of the envelope of the second RF signal.

According to various embodiments, the power amplifier system further includes a transceiver for providing the first RF signal to the first power amplifier and for providing the envelope of the first RF signal to the envelope tracker.

In some embodiments, the power amplifier system further includes an input stage for driving the first power amplifier.

In certain embodiments, the supply voltage of the first power amplifier is provided to the input stage.

In various embodiments, the power amplifier system further includes a second inductor electrically connected between the input stage and the envelope tracker and a second capacitor electrically connected between the input stage and the envelope tracker, the second capacitor and the second inductor having a resonance near the first frequency.

In certain embodiments, the present disclosure relates to a method for reducing capacitance in a power amplifier system. The method includes providing a first power amplifier for amplifying a first radio frequency (RF) signal of a first frequency, providing an envelope tracker for controlling a supply voltage of the first power amplifier using an envelope of the first RF signal, electrically connecting a first inductor between the first power amplifier and the envelope tracker, and electrically connecting a first capacitor between the first power amplifier and the envelope tracker. The first capacitor and the first inductor having a resonance near the first frequency.

In a number of embodiments, an impedance of the first capacitor and the first inductor is greater than about 200 Ω at the first frequency.

In some embodiments, the method further includes providing a second power amplifier to amplify a second RF signal of a second frequency, the envelope tracker configured to control a supply voltage of the second power amplifier using an envelope of the second RF signal.

In certain embodiments, the method further includes electrically connecting a second inductor between the second power amplifier and the envelope tracker and electrically connecting a second capacitor between the second power amplifier and the envelope tracker. The second capacitor and the second inductor have a resonance near the second frequency.

According to various embodiments, the method further includes providing an input stage for driving the first power amplifier.

In some embodiments, the method further includes providing the supply voltage of the first power amplifier to the input stage using the envelope tracker.

In a number of embodiments, the method further includes electrically connecting a second inductor between the input stage and the envelope tracker and electrically connecting a second capacitor between the input stage and the envelope tracker. The second capacitor and the second inductor have a resonance near the first frequency.

In certain embodiments, the present disclosure relates to a mobile device including a phone board and a first power amplifier module disposed on the phone board for amplifying a first radio frequency (RF) signal of a first frequency. The first power amplifier module includes a carrier substrate and a first power amplifier die mounted on the carrier substrate. The phone board further includes an envelope tracking module disposed on the phone board adjacent the first power amplifier module, the envelope tracking module configured to control a supply voltage of the first power amplifier die using an envelope of the first RF signal. The phone board further includes a first inductor electrically connected between the first power amplifier die and the envelope tracking module and a first capacitor electrically connected between the first power amplifier die and the envelope tracker. The first capacitor and the first inductor have a resonance near the first frequency.

In some embodiments, the first power amplifier module is further configured to amplify a second RF signal of a second frequency and the first power amplifier module includes a second power amplifier die mounted on the carrier substrate adjacent the first power amplifier die. The envelope tracking module is configured to control a supply voltage of the second power amplifier die using an envelope of the second RF signal.

In a number of embodiments, the mobile device further includes a second inductor electrically connected between the second power amplifier die and the envelope tracking module and a second capacitor electrically connected between the second power amplifier die and the envelope tracking module. The second capacitor and the second inductor have a resonance near the second frequency.

In some embodiments, the mobile device further includes a second inductor having a first end electrically connected to the envelope tracking module and a second end electrically connected to a first end of the first capacitor and to a supply pin of the second power amplifier die. The first capacitor includes a second end electrically connected to a supply pin of the first power amplifier die.

In certain embodiments, the second inductor and the first capacitor are configured to resonate near the second frequency such that the impedance of the second inductor and the first capacitor is greater at the second frequency than at a frequency of the envelope of the second RF signal.

According to a number of embodiments, the first RF signal is a Band I signal and the second RF signal is a Band II signal.

In some embodiments, the first RF signal is a Band V signal and the second RF signal is a Band VIII signal.

In various embodiments, the mobile device further includes a second power amplifier module mounted on the phone board adjacent the first power amplifier module. The envelope tracking module is configured to control a supply voltage of the second power amplifier module.

In certain embodiments, the mobile device further includes a front end module and an antenna mounted on the phone board. The front end module is electrically connected to the first and second power amplifier modules and the antenna is electrically connected to the front end module.

In a number of embodiments, the first capacitor and the first inductor are disposed on the carrier substrate of the first power amplifier module.

In some embodiments, the first inductor is formed from a trace on the carrier substrate and the first capacitor is a surface mount component mounted on the carrier substrate.

In various embodiments, the first inductor is a surface mount component mounted on the carrier substrate and the first capacitor is a surface mount component mounted on the carrier substrate.

BRIEF DESCRIPTION OF THE DRAWINGS

FIG. 8E is a schematic block diagram of a multi-band power amplifier system in accordance with yet another embodiment.

DETAILED DESCRIPTION OF EMBODIMENTS

The headings provided herein, if any, are for convenience only and do not necessarily affect the scope or meaning of the claimed invention.

Overview of Power Amplifier Systems

Figure 1:
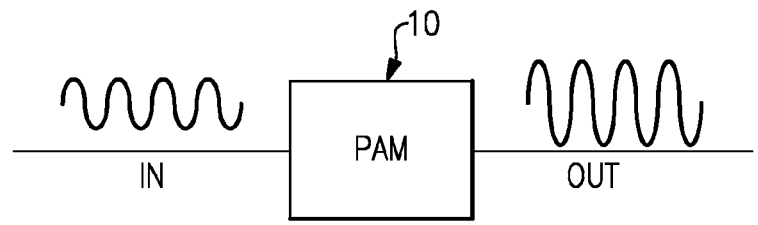
FIG. 1 is a schematic diagram of a power amplifier module for amplifying a radio frequency (RF) signal.

FIG. 1 is a schematic diagram of a power amplifier module for amplifying a radio frequency (RF) signal. The illustrated power amplifier module (PAM) 10 can be configured to amplify an RF signal IN to generate an amplified RF signal OUT. As described herein, the power amplifier module can include one or more power amplifiers.

Figure 2:
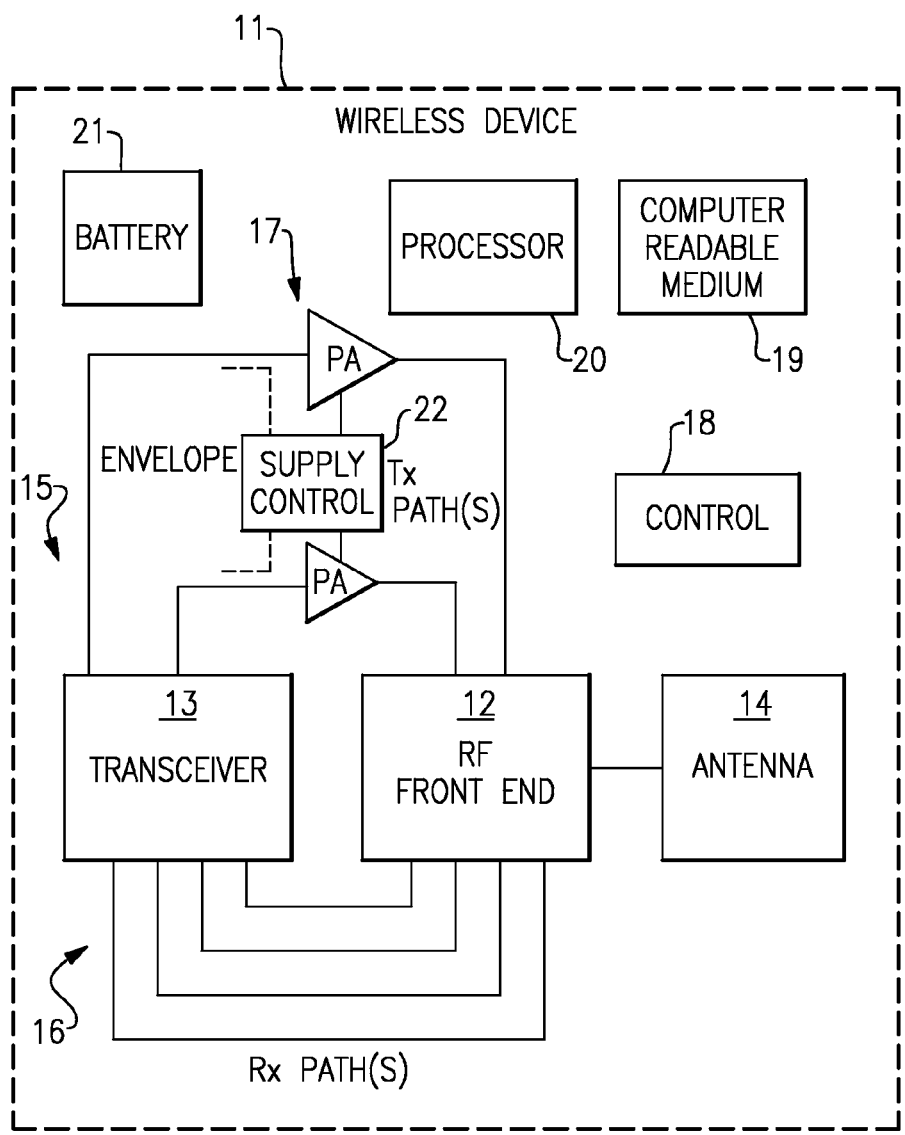
FIG. 2 is a schematic block diagram of an example wireless device that can include one or more of the power amplifier modules of FIG. 1.

FIG. 2 is a schematic block diagram of an example wireless or mobile device 11 that can include one or more of the power amplifier modules of FIG. 1. The wireless device 11 can include power amplifiers implementing one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more features of the present disclosure can be implemented in the foregoing example modes and/or bands, and in other communication standards. For example, 3G, 4G, LTE, and advanced LTE are non-limiting examples of such standards.

In certain embodiments, the wireless device 11 can include a RF front end 12, a transceiver component 13, an antenna 14, power amplifiers 17, a control component 18, a computer readable medium 19, a processor 20, a battery 21, and supply control block 22.

The transceiver component 13 can generate RF signals for transmission via the antenna 14. Furthermore, the transceiver component 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although the configuration illustrated in FIG. 2 includes two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although the configuration illustrated in FIG. 2 includes four receiving paths 16, the wireless device 11 can be adapted to include more or fewer receiving paths 16.

To facilitate switching between receive and transmit paths, the RF front end 12 can be configured to electrically connect the antenna 14 to a selected transmit or receive path. Thus, the RF front end 12 can provide a number of switching functionalities associated with an operation of the wireless device 11. In certain embodiments, the RF front end 12 can include a number of switches configured to provide functionalities associated with, for example, switching between different bands, switching between different power modes, switching between transmission and receiving modes, or some combination thereof. The RF front end 12 can also be configured to provide additional functionality, including filtering of signals. For example, the RF front end 12 can include one or more duplexers.

FIG. 2 shows that in certain embodiments, a control component 18 can be provided, and such a component can be configured to provide various control functionalities associated with operations of the RF front end 12, the power amplifiers 17, the supply control 22, and/or other operating component(s). Non-limiting examples of the control component 18 are described herein in greater detail.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The illustrated wireless device 11 also includes the supply control block 22, which can be used to provide a power supply to one or more of the power amplifiers 17. For example, the supply control block 22 can be an envelope tracker configured to change or vary the supply voltage provided to the power amplifiers 17 based upon an envelope of the RF signal to be amplified. However, in certain embodiments the supply control block 22 can be other blocks, including, for example, a DC-to-DC converter.

The supply control block 22 can be electrically connected to the battery 21, and the supply control block 22 can be configured to change the voltage provided to the power amplifiers 17 based on an envelope of the RF signal to be amplified. The battery 21 can be any suitable battery for use in the wireless device 11, including, for example, a lithium-ion battery. As will be described in detail further below, by controlling the voltage provided to the power amplifiers, the power consumption of the battery 21 can be reduced, thereby improving performance of the wireless device 11. As illustrated in FIG. 2, the envelope signal can be provided to the supply control block 22 from the transceiver 13. However, the envelope can be determined in other ways. For example, the envelope can be determined by detecting the envelope from the RF signal using any suitable envelope detector.

Figure 3:
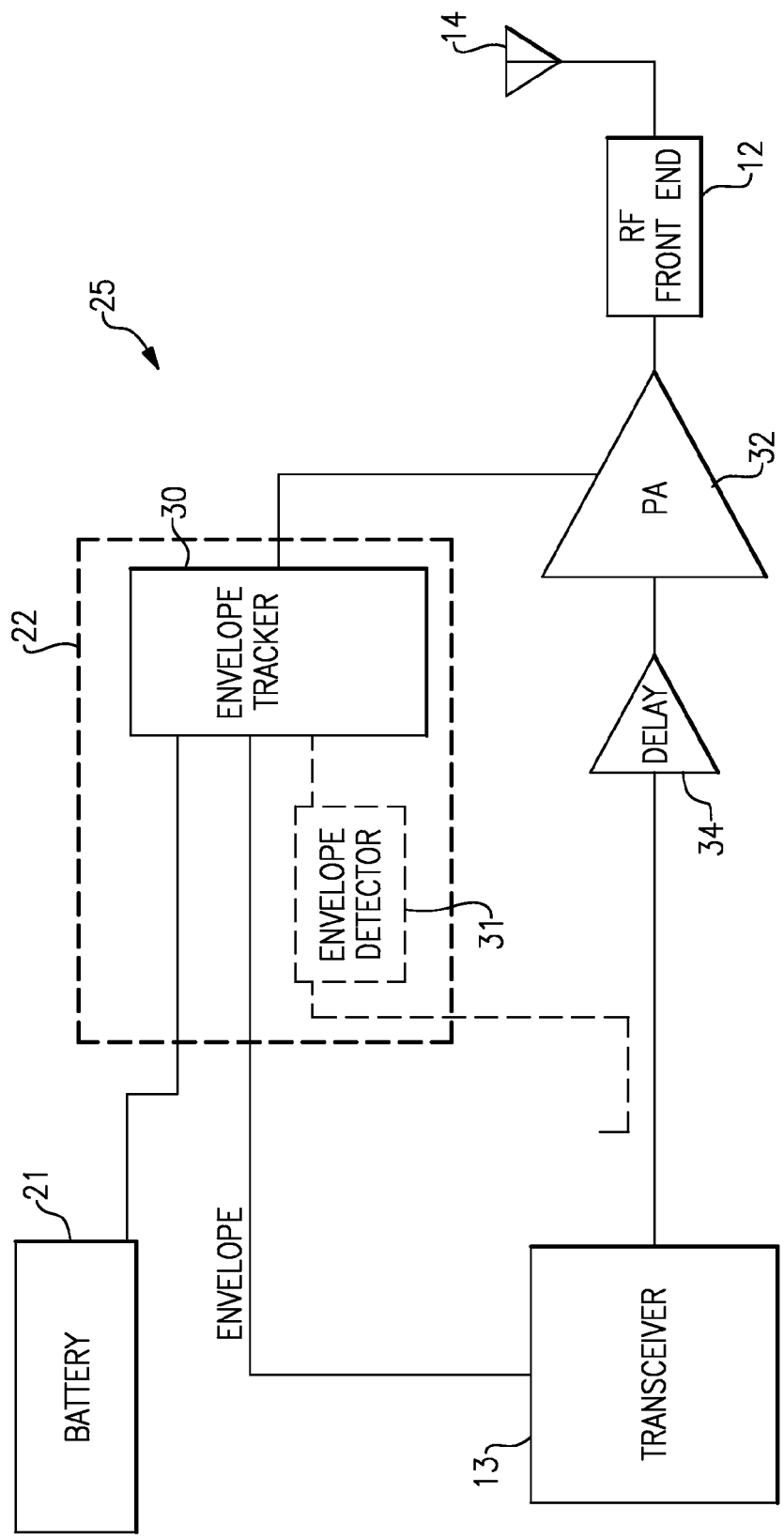
FIG. 3 is a schematic block diagram of one example of a power amplifier system having an envelope tracker.

FIG. 3 is a schematic block diagram of one example of a power amplifier system 25 having an envelope tracker 30. The illustrated system includes the RF front end 12, the transceiver 13, the antenna 14, the battery 21, a delay element 34, a power amplifier or PA 32, and a supply control block 22 including the envelope tracker 30.

The transceiver 13 can generate an RF signal, and can provide the RF signal to a delay element 34. The delay element 34 can receive the RF signal and can delay the RF signal to compensate for a delay in generating a supply voltage for the power amplifier 32. The power amplifier 32 can amplify the delayed RF signal and provide the amplified signal to an input of the RF front end 12, which can include a duplexer and/or one or more switches, as was described earlier. The RF front end 12 can have an output electrically connected to the antenna 14. Although not illustrated in this figure, persons of ordinary skill in the art will appreciate that more or fewer power amplifiers can be electrically connected to the antenna 14 through the RF front end 12 to aid in providing a desired number of transmit and/or receive paths.

The transceiver 13 can provide the envelope of the RF signal to the supply control block 22. The supply control block 22 can include an envelope tracker 30 configured to receive a voltage from the battery 21. The envelope tracker 30 can generate a power amplifier supply voltage for the power amplifier 32. Additionally, the envelope tracker 30 can control the voltage level of the power amplifier supply voltage to change in relation to the envelope of the RF signal.

Although the transceiver 13 is illustrated as providing the envelope to the envelope tracker 30, the envelope of the signal can be generated in any suitable manner. For example, an envelope detector 31 can be included to generate an envelope signal from the RF signal.

Figure 4A:
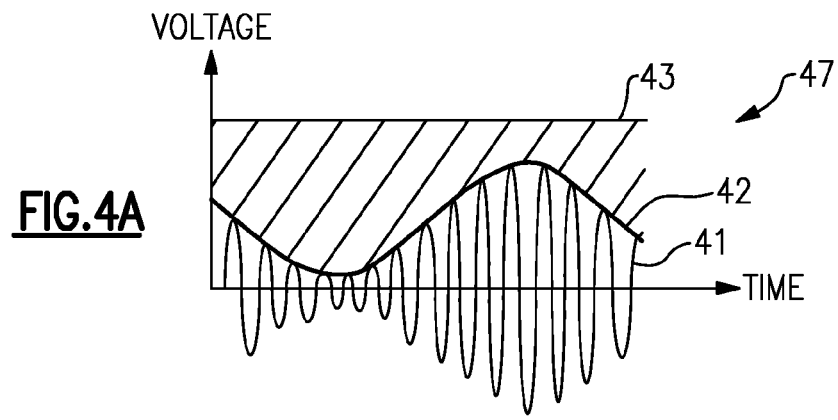
FIGS. 4A-4C show three examples of a power supply voltage versus time.
Figure 4B:
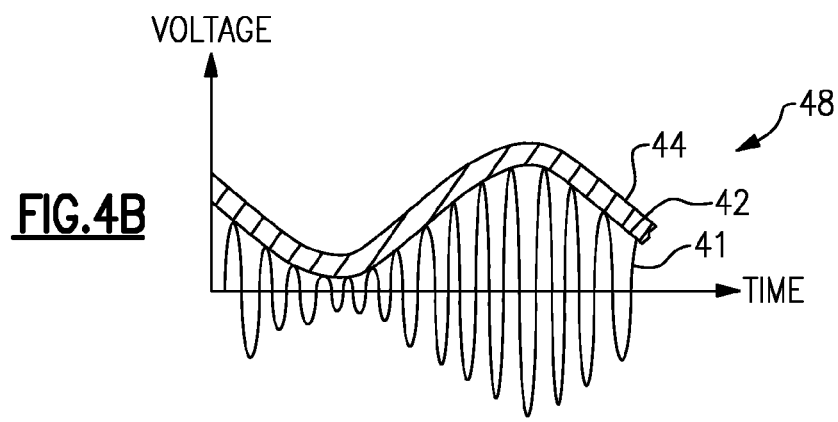
Figure 4C:
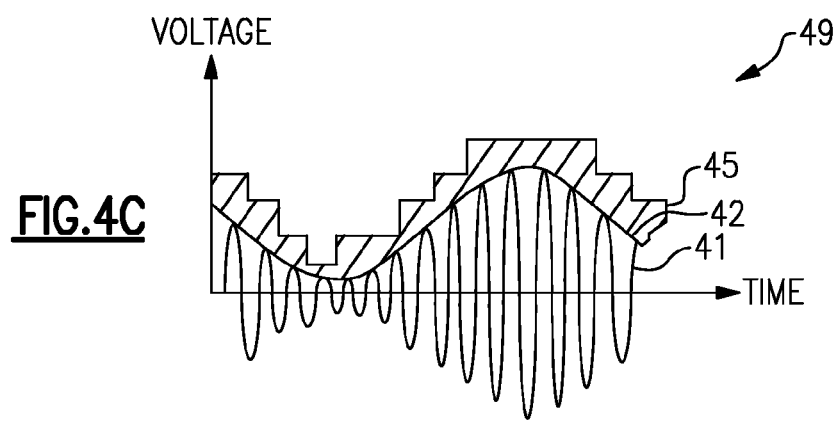

FIGS. 4A-4C show three examples of a power supply voltage versus time.

In FIG. 4A, a graph 47 illustrates the voltage of a RF signal 41 and a power amplifier supply 43 versus time. The RF signal 41 has a signal envelope 42.

It can be important that the power supply 43 of a power amplifier has a voltage greater than that of the RF signal 41. For example, providing a supply voltage to a power amplifier having a magnitude less than that of the RF signal 41 can clip the RF signal, thereby creating signal distortion and/or other problems. Thus, it is important the power supply voltage 43 be greater than that of the signal envelope 42. However, it can be desirable to reduce a difference in voltage between the power supply 43 and the envelope 42 of the RF signal 41, as the area between the power amplifier supply 43 and the signal envelope 42 can represent lost energy, which can reduce battery life and increase heat generated in a mobile device.

In FIG. 4B, a graph 48 illustrates the voltage of a RF signal 41 and a power amplifier supply 44 versus time. In contrast to the power amplifier supply 43 of FIG. 4A, the power amplifier supply 44 of FIG. 4B varies or changes in relation to the envelope 42 of the RF signal 41. The area between the power amplifier supply 44 and the signal envelope 42 in FIG. 4B is less than the area between the power amplifier supply 43 and the signal envelope 42 in FIG. 4A, and thus the graph 48 of FIG. 4B can be associated with a power amplifier system having greater energy efficiency.

FIG. 4C is a graph 49 illustrating a power supply voltage 45 that varies in relation to the envelope 42 of the RF signal 41. In contrast to the power supply voltage 44 of FIG. 4B, the power supply voltage 45 of FIG. 4C changes in discrete voltage increments. Certain implementations described herein can be used in combination with envelope trackers or other supply control modules that change a power supply voltage in relation to an envelope either continuously or in discrete increments.

Figure 5:
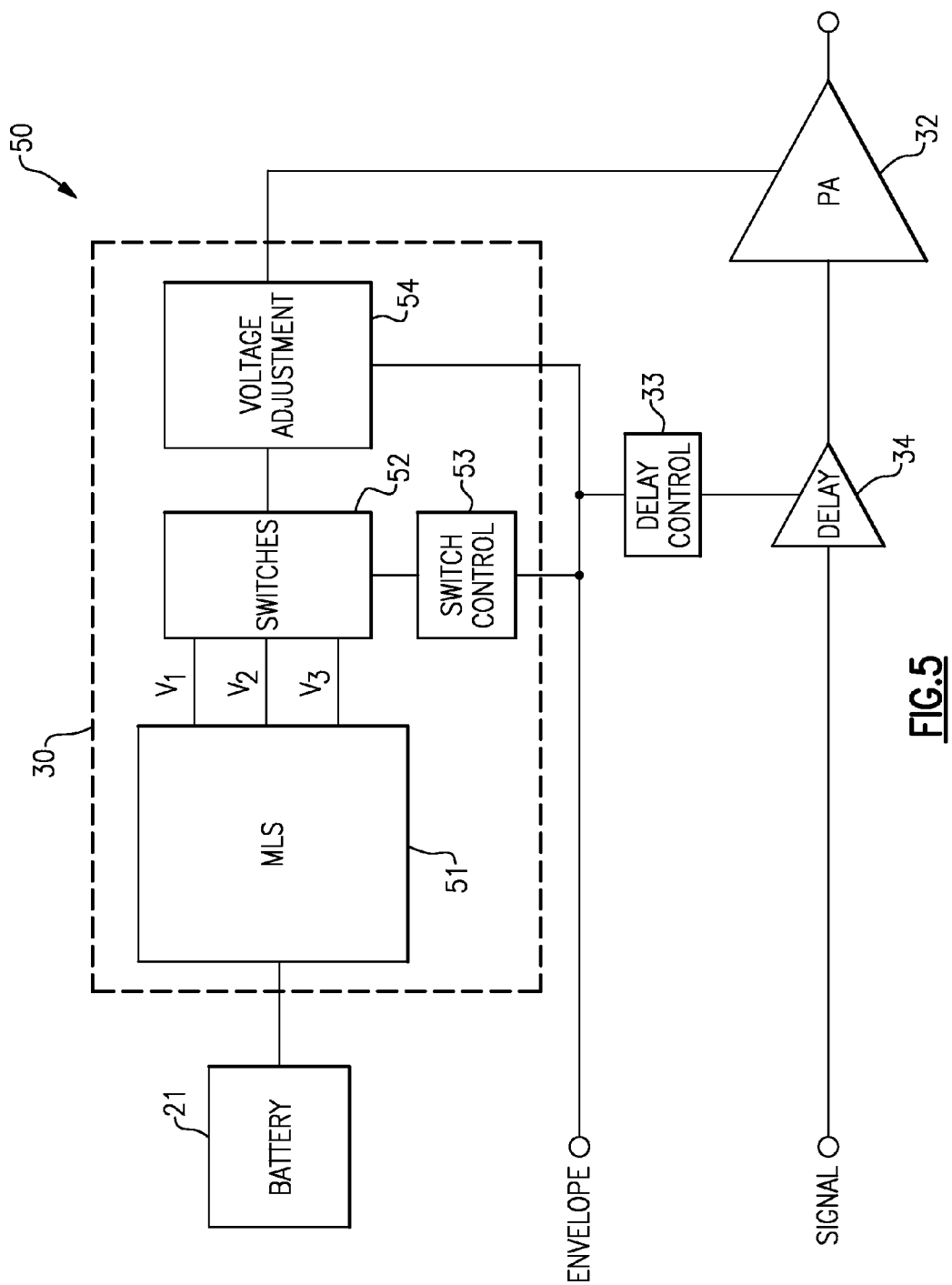
FIG. 5 is a schematic block diagram of another example of a power amplifier system having an envelope tracker.

FIG. 5 is a schematic block diagram of another example of a power amplifier system 50 having an envelope tracker 30. The illustrated power amplifier system 50 includes the battery 21, the envelope tracker 30, the power amplifier 32, the delay block 34, and a delay control block 33. The envelope tracker 30 includes a multi-level supply block 51, switches 52, switch control 53, and a voltage adjustment block 54.

As shown in FIG. 5, the example power amplifier system 50 can receive a RF signal and an envelope signal, and can use the envelope signal to control a voltage level of a power supply of the power amplifier 32. In order to compensate for delays in generating the power amplifier supply voltage, the delay block 34 can be used to aid in aligning the RF signal to be amplified and the power amplifier supply voltage. For example, a delay control block 33 can be used to control the delay of the delay element 34 using the envelope of the RF signal.

To aid in providing a high-efficiency supply voltage for the power amplifier 32, the illustrated power amplifier system includes a multi-level supply block 51 for generating a plurality of power supplies from the battery 21. For example, the multi-level supply block 51 can be used to generate power supplies $V_1$, $V_2$ and $V_3$ from the battery 21. Although the multi-level supply block 51 is illustrated as generating three power supplies, persons having ordinary skill in the art will appreciate that the multi-level supply block can be configured to generate more or fewer power supplies.

The switch control block 53 can be configured to selected amongst the power supplies generated by the multi-level supply block 51, and the power supply selected by the switch control block 53 can be adjusted by a voltage adjustment block 54 before being provided to the power amplifier 32. In certain implementations, the voltage adjustment block 54 includes one or more linear amplifiers for amplifying an error between the envelope signal and the power amplifier supply voltage generated by the multi-level supply block 51.

By providing both the multi-level supply block 51 and the voltage adjustment block 54, constraints on the design of the power amplifier system can be reduced, thereby permitting a system with greater flexibility and improved power efficiency.

Figure 6:
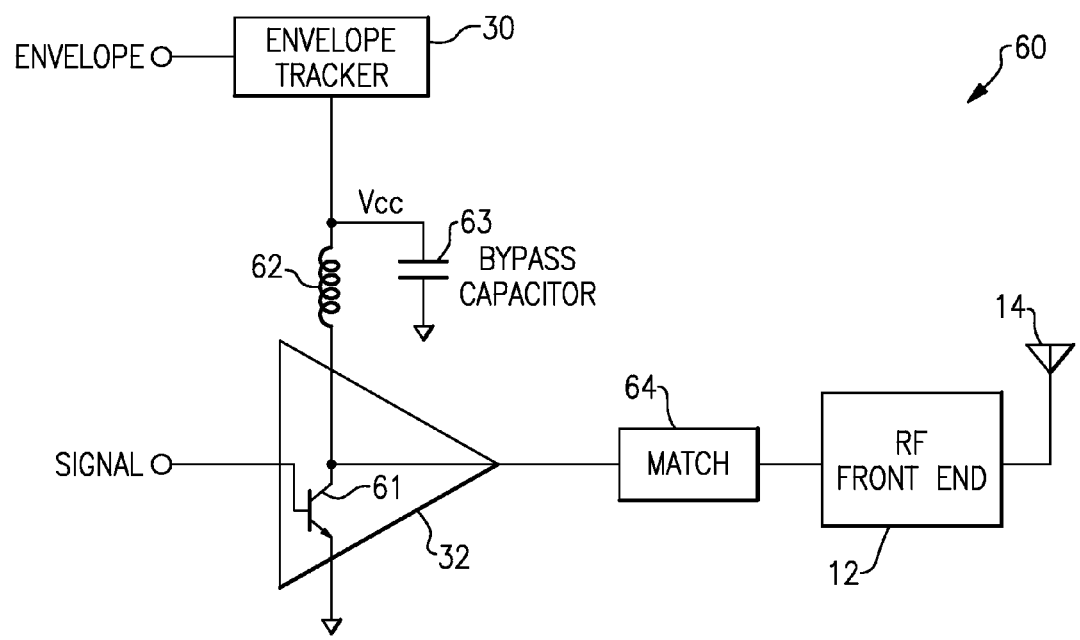
FIG. 6 is a schematic block diagram of yet another example of a power amplifier system having an envelope tracker.

FIG. 6 is a schematic block diagram of yet another example of a power amplifier system 60 having an envelope tracker 30. The illustrated power amplifier system 60 includes the envelope tracker 30, the power amplifier 32, an inductor 62, a bypass capacitor 63, an impedance matching block 64, the front end module 12, and the antenna 14. The illustrated envelope tracker 30 is configured to receive an envelope of the signal and to generate a power amplifier supply voltage Vcc for the power amplifier 32.

The illustrated power amplifier 32 includes a bipolar transistor 61 having an emitter, a base, and a collector. The emitter of the bipolar transistor 61 can be electrically connected to a power low supply, such as a ground node, and a radio frequency (RF) signal can be provided to the base of the bipolar transistor 61. The bipolar transistor 61 can amplify the RF signal, and provide the amplified RF signal at the collector. The bipolar transistor 61 can be any suitable device. In one implementation, the bipolar transistor 61 is a heterojunction bipolar transistor (HBT).

The power amplifier 32 can be configured to provide the amplified RF signal to the front end module 12. The impedance matching block 64 can be used to aid in terminating the electrical connection between the power amplifier 32 and the RF front end 12. For example, the impedance matching block 64 can be used to increase power transfer and/or reduce reflections of the amplified RF signal. In certain implementations, the inductor 62 can be configured to operate as part of the impedance matching block 64.

The inductor 62 can be included to aid in biasing the power amplifier 32 with the power amplifier supply voltage Vcc generated by the envelope tracker 30. The inductor 62 can include a first end electrically connected to the envelope tracker 30, and a second end electrically connected to the collector of the bipolar transistor 61. The bypass capacitor 63 can have a first end electrically connected to the power amplifier supply voltage Vcc and a second end electrically connected to a power low supply, and can perform a wide variety of functions. For example, including the bypass capacitor 63 can aid in reducing noise of the supply voltage Vcc and/or to aid in stabilizing the output of the power amplifier 32. Additionally, the bypass capacitor 63 can be used to provide an RF/AC ground for the inductor 62, such as in implementations in which the inductor 63 is used as a part of the impedance matching block 64.

Although FIG. 6 illustrates one implementation of the power amplifier 32, skilled artisans will appreciate that the teachings described herein can be applied to a variety of power amplifier structures, including, for example, multi-stage power amplifier structures and power amplifiers employing other transistor structures, including, for example, field-effect transistors.

Figure 7:
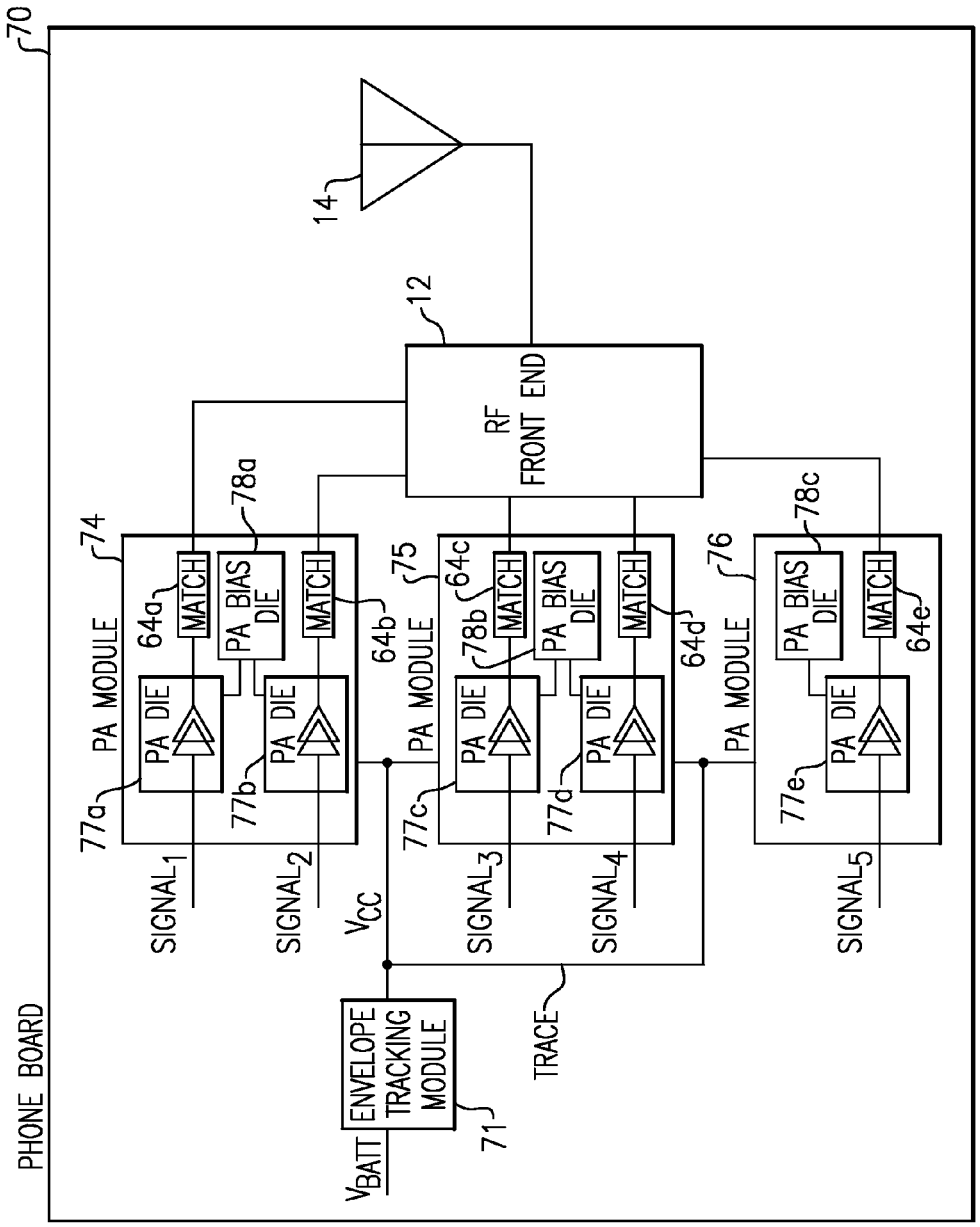
FIG. 7 is a schematic block diagram of one example of a phone board having an envelope tracking module.

FIG. 7 is a schematic block diagram of one example of a phone board 70 having an envelope tracking module 71. The illustrated phone board 70 includes the envelope tracking module 71, a first power amplifier (PA) module 74, a second PA module 75, a third PA module 76, a RF front end 12, and an antenna 14. The first, second and third PA modules 74-76 can operate using a power amplifier supply voltage $V_{CC}$ generated by the envelope tracking module 71.

The first, second and third PA modules 74-76 can each be, for example, a multi-chip module (MCM) including a plurality of dies mounted on a surface of a carrier substrate. The first illustrated PA module 74 includes a first PA die 77a, a second PA die 77b, a first match circuit 64a, a second match circuit 64b, and a first PA bias die 78a. The second illustrated PA module 75 includes a third PA die 77c, a fourth PA die 77d, a third match circuit 64c, a fourth match circuit 64d, and a second PA bias die 78b. The third illustrated PA module 76 includes a fifth PA die 77e, a fifth match circuit 64e, and a third PA bias die 78c. By integrating a plurality of dies and/or other components on a module, a wide variety of advantages can be achieved, including, for example, reduction of cost, improved ease of manufacture, and/or reduction in the length of interconnections.

The envelope tracking module 71 can include one or more dies and/or other components configured to generate a supply voltage $V_{CC}$ for the PA modules 74-76 using a battery voltage $V_{BATT}$. The supply voltage $V_{CC}$ can be used by the PA dies of each PA module to improve power efficiency of one or more power amplifiers disposed on each PA die, as was described earlier. Although not illustrated in this figure, each PA module can be configured to receive additional supply voltages. For example, the PA bias dies 78a-78c, which can be used for biasing the PA dies, typically operate on a separate supply voltage. Furthermore, a portion of the PA dies 77a-77e, including, for example, power amplifier input stages, can operate on a separate supply voltage in certain implementations.

As illustrated in FIG. 7, the first, second and third PA modules 74-76 can be configured to operate over a plurality of RF bands. For example, the first PA module 74 has been configured to receive a first RF signal and a second RF signal, which can be, for instance, a Band I or W-CDMA 2100 signal and a Band II or W-CDMA 1900 signal, respectively. Additionally, the second PA module 75 has been configured to receive a third RF signal and a fourth RF signal, which can be, for example, a Band V or W-CDMA 850 signal and a Band VIII or W-CDMA 900 signal, respectively. Furthermore, the third PA module 76 has been configured to receive a fifth RF signal, which can be, for example, a Band IV or W-CDMA 1700 signal. Although one particular configuration of a multi-band phone board 70 has been illustrated, the phone board 70 can include more or fewer PA modules and/or operate over more or fewer bands.

By providing a phone board 70 having a capability to operate over a plurality of bands, the flexibility of a mobile device using the phone board 70 can be improved. For example, a PA die associated with a particular band can be selectively enabled to permit transmission over a particular band, thereby permitting the mobile phone to be used in a wide variety of networks. The RF front end 12 can be configured to multiplex the outputs of the PA dies so as to electrically connect an activated band to the antenna 14. Additional details of the RF front end 12 and the antenna 14 can be as described above.

Overview of Capacitive Load Reduction Circuits

A supply control block, such as an envelope tracker, can be used to control a power amplifier supply voltage to improve the efficiency of a power amplifier system. It can be important to reduce the capacitive load of the envelope tracker or other supply control module. For example, the size and/or cost of an envelope tracker can increase as the load capacitance of the envelope tracker increases. Thus, to provide adequate performance for a power amplifier system, it can be important to reduce the load capacitance of an envelope tracker. However, a relatively large capacitance may be needed local to each power amplifier to aid in reducing noise on the supply node and/or to aid in providing stability to the power amplifiers. For example, failure to provide sufficient capacitance on the supply node for a power amplifier can generate unwanted output oscillations or other undesirable effects.

The problems associated with capacitive loading of an envelope tracker can be exacerbated when envelope tracking is utilized in a power amplifier system that includes multiple power amplifiers, such as the phone board 70 of FIG. 7. To reduce cost and/or to improve efficiency of the multi-PA system, a single envelope tracker can be configured to control the level of the power supply voltage provided to a plurality of power amplifiers. However, problems associated with power amplifier stability, band-to-band isolation, and/or power supply noise can be exacerbated when using an envelope tracker to provide a power supply to a plurality of power amplifiers.

Conventional power amplifier systems can include relatively large bypass capacitors electrically connected to the power supply of a power amplifier. The bypass capacitors can aid in stabilizing the voltage provided to the power amplifier and can improve power amplifier system performance, including power amplifier linearity, stability and/or band-to-band isolation.

When employing bypass capacitors in a power amplifier system using an envelope tracker or other supply control module, the bypass capacitors can load the envelope tracker. However, omitting the bypass capacitors can reduce system performance and may even render the power amplifier system non-operational over all or a portion of the range of operation of the power amplifier system. For example, a power amplifier system may need to operate under a varying voltage standing wave ratio (VSWR), such as a VSWR that can vary by a factor of six or more times. Removal of the bypass capacitors can result in the power amplifier system exhibiting undesirable oscillations or instability when the VSWR is varied. Additionally, the power amplifier system may need to accommodate a varying amount of transmission line, such as board trace between the power amplifier and the envelope tracker, and the power amplifier system may exhibit instability or harmonics at particular line lengths when the bypass capacitors are removed.

Apparatus and methods for reducing the load capacitance of an envelope tracker are described herein. In certain implementations, a parallel inductor-capacitor (LC) circuit including a capacitor and a choke inductor is provided between a supply input of a power amplifier and an envelope tracker. The capacitor and the choke inductor are configured to have a resonance at a signal frequency near the center frequency of the RF signal amplified by the power amplifier. By configuring the parallel LC circuit to have a resonance near the signal frequency, the impedance of the parallel LC circuit is relatively high at the signal frequency. Additionally, the parallel LC circuit can have a relatively low impedance at the envelope frequency of the RF signal such that the capacitive loading of the parallel LC circuit on the envelope tracker is relatively small.

In other implementations, first and second choke inductors are positioned between an envelope tracker and the supply nodes of first and second power amplifiers, respectively, and a capacitor is placed between the supply nodes of the first and second power amplifiers. The capacitor and the first inductor are configured to have a resonance at a first signal frequency near the center frequency of the RF signal amplified by the first power amplifier. At the first signal frequency, the impedance of the resonant circuit including the capacitor and the first inductor is relatively high, and the resonant circuit provides supply capacitance to the first power amplifier. Additionally, the capacitor and the second inductor are configured to have a resonance at a second signal frequency near the center frequency of the RF signal amplified by the second power amplifier, so that the circuit provides supply capacitance to the second power amplifier. The envelope tracker is electrically connected to each end of the bypass capacitor through the first and second inductors such that the resonant circuit provides a relatively small load capacitance on the envelope tracker at the envelope frequencies of the first and second RF signals.

Figure 8A:
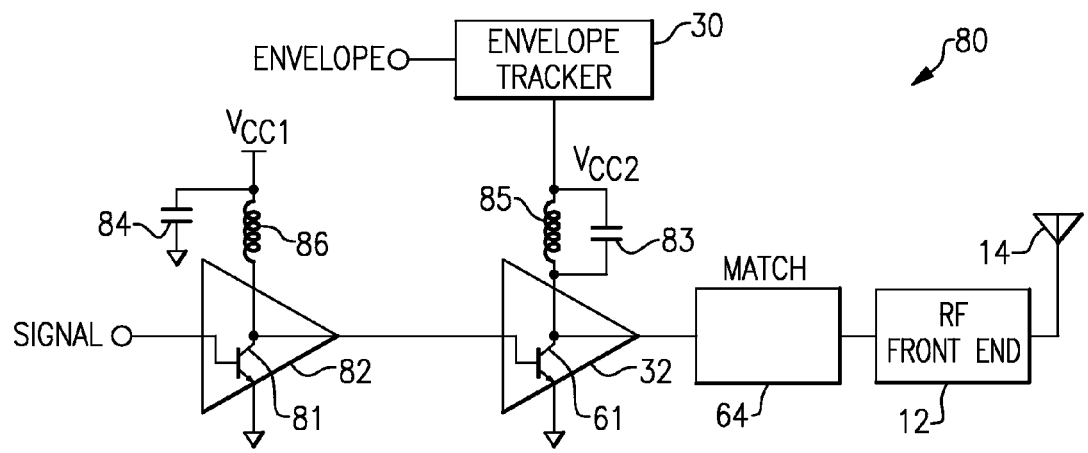
FIG. 8A is a schematic block diagram of a power amplifier system in accordance with one embodiment.

FIG. 8A is a schematic block diagram of a power amplifier system 80 in accordance with one embodiment. The illustrated power amplifier system 80 includes an envelope tracker 30, a power amplifier input stage 82 configured to receive a RF signal, a power amplifier 32, a first capacitor 83, a second capacitor 84, a first inductor 85, a second inductor 86, an impedance matching block 64, a front end module 12, and an antenna 14. The illustrated envelope tracker 30 is configured to receive an envelope of the RF signal and to generate a power amplifier supply voltage $V_{CC2}$ for the power amplifier 32. The input stage 82 can be configured to receive a separate supply voltage $V_{CC1}$.

The illustrated power amplifier 32 includes a first bipolar transistor 61 and the illustrated input stage 82 includes a second bipolar transistor 81, and the first and second bipolar transistors 61, 81 each include an emitter, a base, and a collector. The first and second bipolar transistors 61, 81 can be any suitable device, including, for example, heterojunction bipolar transistors (HBTs). The emitters of the first and second bipolar transistors 61, 81 can be electrically connected to a power low supply, such as a ground node or any other suitable supply, and a RF signal can be provided to the base of the second bipolar transistor 81. The collector of the second bipolar transistor 81 is electrically connected to the base of the first bipolar transistor 61, and the collector of the first bipolar transistor 61 is electrically connected to the front end module 12 and to the match block 64. The first and second bipolar transistors 61, 81 can be used to amplify the RF signal to a level suitable for use by the RF front end 12 and the antenna 14. Inclusion of the match block 64 can aid in reducing reflections of the amplified RF signal generated at the collector of the first bipolar transistor 61, as was described above. Employing a multi-stage amplifier that includes both the input stage 82 and the power amplifier 32 can aid in reducing the design constraints of the power amplifier 32 relative to a single-stage power amplifier design, thereby improving design flexibility.

The first inductor 85 can aid in biasing the power amplifier 32 with the power amplifier supply voltage $V_{CC2}$ generated by the envelope tracker 30. The first inductor 85 includes a first end electrically connected to the envelope tracker 30, and a second end electrically connected to the collector of the first bipolar transistor 61. To aid in providing capacitance for the supply node of the power amplifier 32, such as capacitance used to achieve stability and/or noise performance of the power amplifier 32, the first capacitor 83 has been provided in parallel with the first inductor 85. The first capacitor 83 includes a first end electrically connected to the first end of the first inductor 85 and to the envelope tracker 30 and a second end electrically connected to the second end of the first inductor 85 and to the collector of the first bipolar transistor 61.

The first inductor 85 and the first capacitor 83 operate as a parallel LC circuit, and can be configured to have a resonance at a signal frequency near the center frequency of the RF signal amplified by the power amplifier 32. By adapting the first inductor 85 and the first capacitor 83 to resonate near this frequency, the impedance of the parallel LC circuit can be relatively high at the signal frequency such that the parallel LC circuit operates as a capacitor for the power amplifier 32. Providing capacitance for the power amplifier 32 at the signal frequency can aid in achieving stability of the power amplifier system, including stability over a wide range of transmission line lengths between the envelope tracker 30 and the power amplifier 32. However, the parallel LC circuit can have a relatively low impedance at the envelope frequency of the RF signal amplified by the power amplifier 32 so that the parallel LC circuit provides a relatively small capacitive loading on the envelope tracker 30. Reducing the capacitive load of the envelope tracker 30 can aid in reducing the design complexity, power consumption and/or size of the envelope tracker 30.

The resonance of the first inductor 85 and the first capacitor 83 can be selected to be relatively near the center frequency of the RF signal amplified by the power amplifier 32. For example, the resonance of the parallel LC circuit can be selected so that the magnitude of the impedance of the parallel LC circuit over the transmission band is greater than about 200 Ω. For example, when amplifying a Band I or W-CDMA 2100 signal having a corresponding transmission band ranging between about 1.92 GHz to about 1.98 GHz, the parallel LC circuit can have an impedance greater than about 200 Ω over the transmission band. To aid in achieving this impedance, the first inductor 85 and the first capacitor 83 can have any suitable value. For example, the first inductor 85 can have an inductance ranging between about 1 nH to about 10 nH and the first capacitor 83 can have a capacitance ranging between about 1 pF to about 10 pF.

As illustrated in FIG. 8A, the input stage 82 can receive a separate supply voltage $V_{CC1}$ that is different than the power amplifier supply voltage $V_{CC2}$ that is generated by the envelope tracker 30. Employing separate supply voltages for the power amplifier 32 and the input stage 82 can reduce power supply noise and/or capacitive loading of the envelope tracker 30. To aid in biasing the input stage 82, the second inductor 86 can be electrically connected between the collector of the second bipolar transistor 81 and the supply voltage $V_{CC1}$. To provide stability to the input stage 82 and to reduce noise on the supply voltage $V_{CC1}$, the second capacitor 84 can be electrically connected between the supply voltage $V_{CC1}$ and any suitable reference node, such as ground.

Figure 8B:
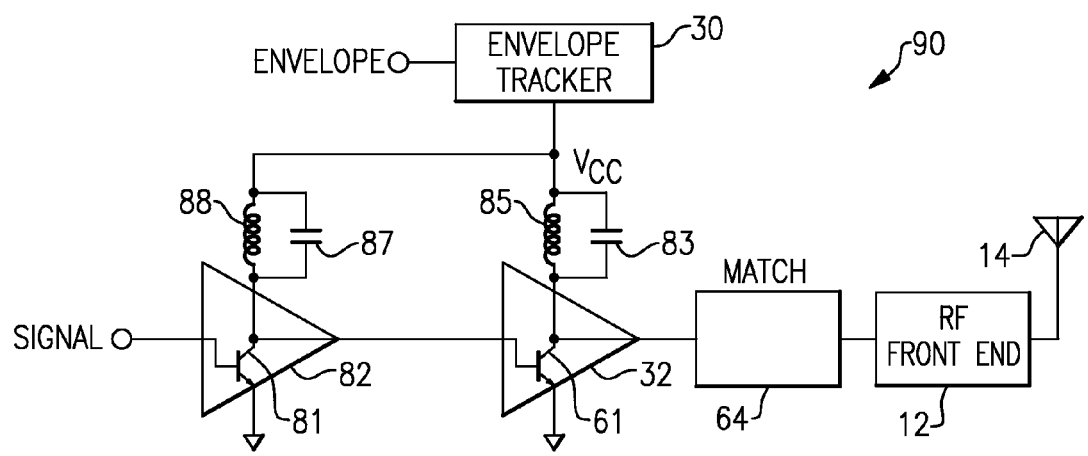
FIG. 8B is a schematic block diagram of a power amplifier system in accordance with another embodiment.

FIG. 8B is a schematic block diagram of a power amplifier system 90 in accordance with another embodiment. The illustrated power amplifier system 90 includes an envelope tracker 30, a power amplifier input stage 82 configured to receive a RF signal, a power amplifier 32, a first capacitor 83, a second capacitor 87, a first inductor 85, a second inductor 88, an impedance matching block 64, a front end module 12, and an antenna 14. The illustrated envelope tracker 30 is configured to receive an envelope of the RF signal and to generate a power amplifier supply voltage $V_{CC}$ for the power amplifier 32 and the input stage 82.

Certain details of the power amplifier system 90 of FIG. 8B can be similar to that of the power amplifier system 80 of FIG. 8A described above. However, in contrast to the power amplifier system 80 of FIG. 8A, the power amplifier system 90 of FIG. 8B includes an input stage 82 that is configured to receive the same supply voltage $V_{CC}$ as the power amplifier 32.

As described above with respect to FIG. 8A, a power amplifier system can include the first capacitor 83 and the first inductor 85 arranged in a first parallel LC circuit configured to resonate near the signal frequency of the RF signal amplified by the power amplifier so as to both decrease capacitive loading of the envelope tracker 30 and to provide supply capacitance to the power amplifier 32 at the signal frequency. To aid in reducing the capacitive loading of the envelope tracker 30 when the envelope tracker 30 is configured to supply power to the input stage 82, a second parallel LC circuit can be provided between the supply voltage $V_{CC}$ and the input stage 82.

The second parallel LC circuit can include the second inductor 88 and the second capacitor 87 arranged in parallel and configured to resonate near the center frequency of the RF signal. For example, the second inductor 88 and the second capacitor 87 can each include a first end electrically connected to the supply voltage $V_{CC}$ and a second end electrically connected to the collector of the bipolar transistor 81, and the second inductor 88 and the second capacitor 87 can be configured to resonate such that the impedance of the second parallel LC circuit over the transmission band is greater than about 200 Ω. Providing parallel LC resonant circuits for both the input stage 82 and the power amplifier 32 can aid in reducing capacitive loading of the envelope tracker 30 in implementations in which it is desired to have both the input stage 82 and the power amplifier 32 operate on a common supply voltage generated by the envelope tracker 30.

Figure 8C:
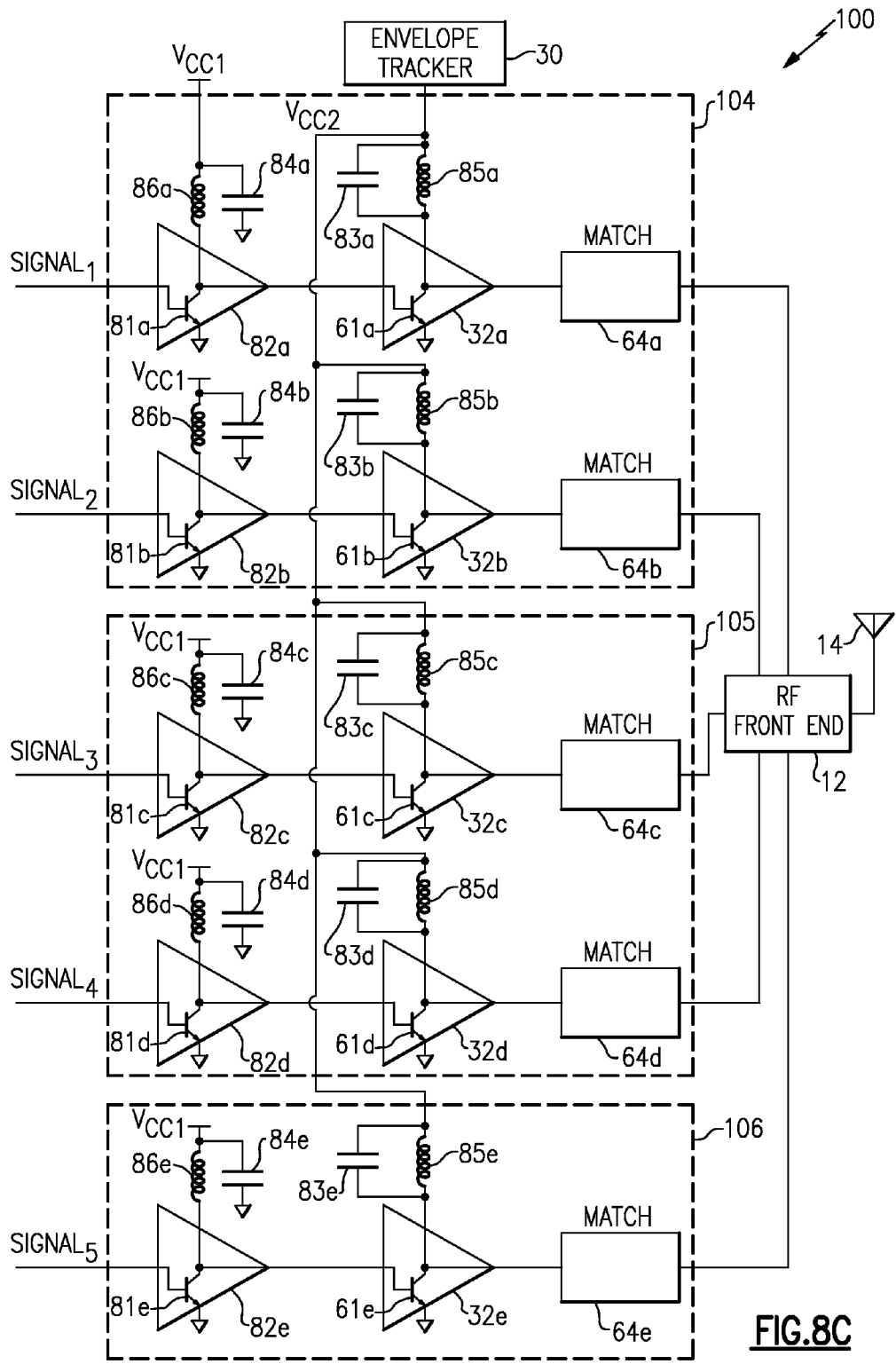
FIG. 8C is a schematic block diagram of a multi-band power amplifier system in accordance with one embodiment.

FIG. 8C is a schematic block diagram of a multi-band power amplifier system 100 in accordance with one embodiment. The illustrated power amplifier system 100 includes an envelope tracker 30, input stages 82a-82e, power amplifiers 32a-32e, a first plurality of capacitors 83a-83e, a second plurality of capacitors 84a-84e, a first plurality of inductors 85a-85e, a second plurality of inductors inductor 86a-86e, impedance matching blocks 64a-64e, a front end module 12, and an antenna 14.

The illustrated power amplifier system 100 is a multi-band power amplifier system, and can be employed in a mobile device that can communicate over different communication bands. The input stages 82a-82e can each receive a different RF input signal for amplification, such as a first, a second, a third, a fourth and a fifth RF signal, respectively, each of which can be any suitable RF signal. For instance, the first RF signal can be a Band I or W-CDMA 2100 signal, the second RF signal can be a Band II or W-CDMA 1900 signal, the third RF signal can be a Band V or W-CDMA 850 signal, the fourth RF signal can be a Band VIII or W-CDMA 900 signal, and the fifth RF signal can be a Band IV or W-CDMA 1700 signal. However, any suitable combination of RF signals can be used. Providing a plurality of power amplifiers in a multi-band power amplifier system can aid in increasing power efficiency of the system and/or in relaxing the design constraints of the power amplifiers, as each power amplifier can be separately optimized for the particular band the power amplifier amplifies.

The input stages 82a-82e are electrically coupled to power amplifiers 32a-32e, respectively, and the input stages 82a-82e and the power amplifiers 32a-32e can be used to amplify the first, second, third, fourth, and fifth RF signals, respectively. In a manner similar to that described earlier, a first plurality of bipolar transistors 61a-61e and a second plurality of bipolar transistors 81a-81e can be used to achieve amplification in the power amplifiers 32a-32e and the input stages 82a-82e, respectively. The input stages 82a-82e and the power amplifiers 32a-32e need not be simultaneously enabled to amplify each of the transmission paths associated with the RF signals. Rather, the outputs of each of the power amplifiers 32a-32e can be provided to the RF front end 12, which can be used to electrically connect the antenna 14 and a selected transmission path associated with an enabled power amplifier. The match blocks 64a-64e can be provided at the outputs of the power amplifiers 32a-32e, respectively, to aid in reducing signal reflections, as was described earlier.

The illustrated envelope tracker 30 has been configured to generate a power amplifier supply voltage $V_{CC2}$ for the power amplifiers 32a-32e. The supply voltage $V_{CC2}$ can be controlled by the envelope tracker 30 in relation to the envelope of the RF signal in the selected transmission path. Although a separate envelope tracker 30 can be employed for each of the power amplifiers 32a-32e, using an envelope tracker 30 to provide a supply voltage to a plurality of power amplifiers can aid in reducing the overall complexity, area and/or or number of components of the multi-band power amplifier system.

However, configuring an envelope tracker 30 to generate a power supply for a plurality of power amplifiers can also exacerbate problems associated with power amplifier stability, linearity, band-to-band isolation, and/or power supply noise. Although including bypass capacitors local to each power amplifier may improve the stability of the power amplifiers, inclusion of bypass capacitors may unduly load the envelope tracker 30. For example, the envelope tracker 30 can have a maximum load capacitance or budget that may be difficult to meet due to capacitance from a variety of sources, such as the capacitance of trace used to interconnect the power amplifier supply nodes, the capacitance of both enabled and disabled power amplifiers, and/or the capacitance of impedance matching blocks of the power amplifiers.

To aid in achieving a relatively small capacitive loading of the envelope tracker 30 while providing capacitance for the power amplifiers 32a-32e sufficient to meet performance requirements, parallel LC circuits can be disposed between the envelope tracker 30 and each of the power amplifiers 32a-32e. For example, the first plurality of capacitors 83a-83e and the first plurality of inductors 85a-85e can be electrically connected so as to provide a parallel LC circuit for each of the power amplifiers 32a-32e and configured to resonate at a frequency near that of the signal amplified by each power amplifier.

For instance, the inductor 85a and the capacitor 83a can be electrically connected in parallel between the supply voltage $V_{CC2}$ and the collector of the bipolar transistor 61a, and the parallel LC circuit can be configured to have a resonance near the first RF signal frequency. Likewise, the inductors 85b-85e and the capacitors 83b-83e can be electrically connected in parallel to form a plurality of parallel LC circuits, which can be disposed between the supply voltage $V_{CC2}$ and the collector of the bipolar transistors 61b-61e and configured to resonate at the second through fifth RF signal frequencies, respectively. By configuring the first plurality of capacitors 83a-83e and the first plurality of inductors 85a-85e in this manner, capacitance can be provided at the signal frequencies to aid in achieving performance of the power amplifiers 32a-32e. Additionally, the parallel LC circuits formed from the first plurality of capacitors 83a-83e and the first plurality of inductors 85a-85e can have a relatively low impedance at the frequencies of the envelopes of the first through fifth RF signals, respectively, and therefore can provide a relatively small capacitive loading to the envelope tracker 30.

As illustrated in FIG. 8C, the input stages 82a-82e can be electrically connected to a supply voltage $V_{CC1}$ that is different than the power amplifier supply voltage $V_{CC2}$ generated by the envelope tracker 30. Employing separate power supply voltages for the power amplifiers 32a-32e and the input stages 82a-82e can reduce power supply noise and/or the loading of the envelope tracker 30. To aid in biasing the input stages 82a-82e, the inductors 86a-86e have been electrically connected between the supply voltage $V_{CC1}$ the collectors of the bipolar transistors 81a-81e, respectively. Additionally, the capacitors 84a-84e have been provided between a power low supply, such as ground, and the supply voltage $V_{CC1}$.

The components of the power amplifier system 100 can be distributed over any suitable combination of ICs and/or other modules. In one implementation, a first power amplifier module 104 includes power amplifiers 32a, 32b and input stages 82a, 82b, a second power amplifier module 105 includes power amplifiers 32c, 32d and input stages 82c, 82d, and a third power amplifier module 106 includes power amplifier 32e and the input stage 82e. The first, second and third power amplifier modules 104-106 can be similar to the power amplifier modules 74-76 of FIG. 7, respectively, and can be multi-chip modules that can be mounted on a phone board.

Figure 8D:
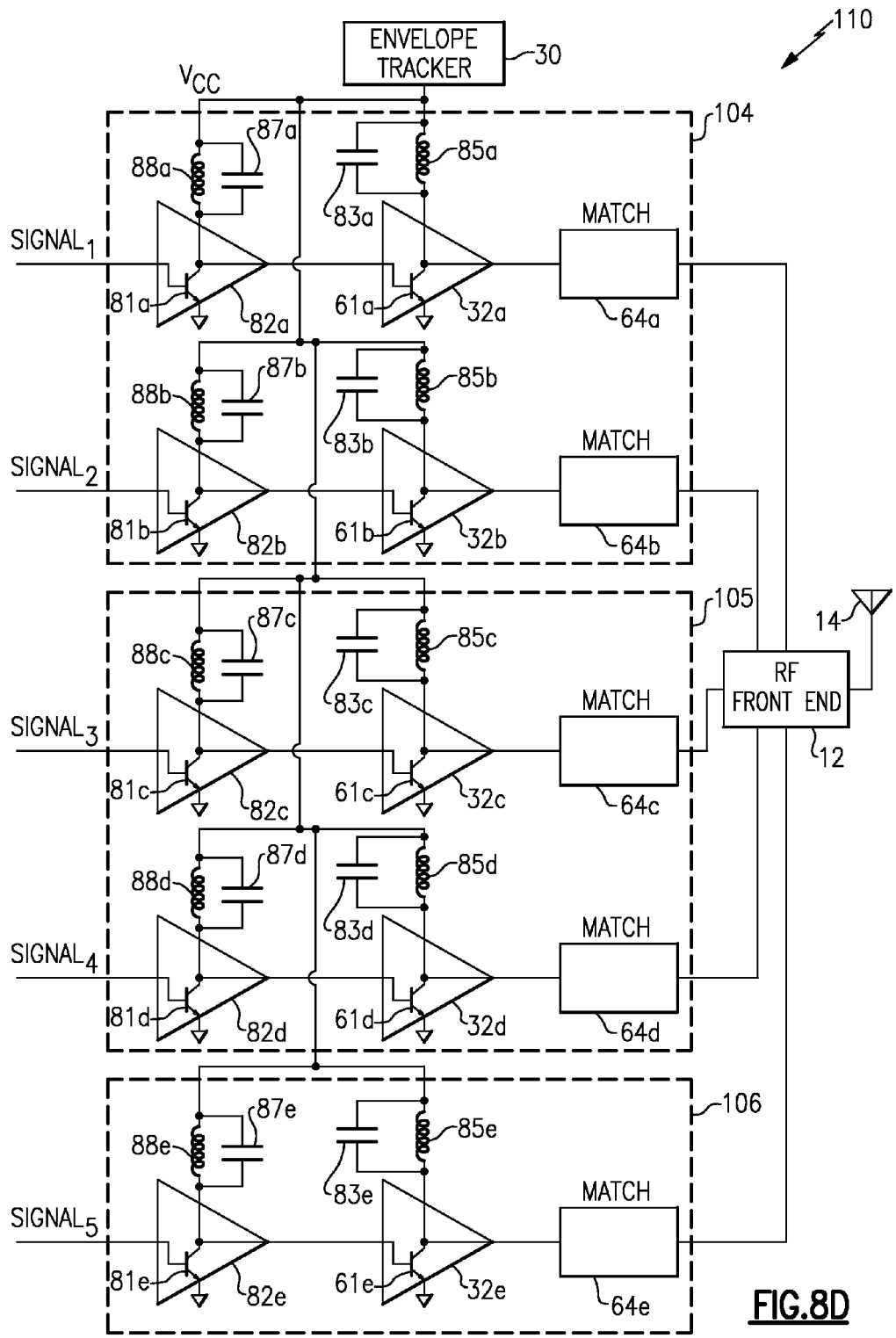
FIG. 8D is a schematic block diagram of a multi-band power amplifier system in accordance with another embodiment.

FIG. 8D is a schematic block diagram of a multi-band power amplifier system 110 in accordance with another embodiment. The illustrated power amplifier system 110 includes an envelope tracker 30, input stages 82a-82e, power amplifiers 32a-32e, a first plurality of capacitors 83a-83e, a second plurality of capacitors 87a-87e, a first plurality of inductors 85a-85e, a second plurality of inductors 88a-88e, impedance matching blocks 64a-64e, a front end module 12, and an antenna 14.

The power amplifier system 110 of FIG. 8D is similar to the power amplifier system 100 of FIG. 8C described above. However, in contrast to the power amplifier system 100 of FIG. 8C, the power amplifier system 110 of FIG. 8D has been configured such that both the input stages 82a-82e and the power amplifiers 32a-32e receive a common supply voltage $V_{CC}$ from the envelope tracker 30.

To aid in reducing the capacitive loading of the envelope tracker 30 when the envelope tracker 30 is also configured to supply power to the input stages 82a-82e, parallel LC circuits formed from inductors 88a-88e and capacitors 87a-87e can be provided between the supply voltage $V_{CC}$ and each of the input stages 82a-82e in a manner similar to that described above. For example, the inductor 88a and the capacitor 87a can be electrically connected in parallel between the supply voltage $V_{CC}$ and the collector of the bipolar transistor 81a, and the parallel LC circuit can be configured to have a resonance at the first RF signal frequency. Likewise, the inductors 88b-88e and the capacitors 87b-87e can be electrically connected in parallel to form a plurality of parallel LC circuits, which can be disposed between the supply voltage $V_{CC}$ and the collector of the bipolar transistors 81b-81e and configured to resonate at the second through fifth RF signal frequencies, respectively. By configuring the inductors 88a-88e and capacitors 87a-87e as parallel LC circuits in this manner, capacitance can be provided to the input stages 82a-82e at the first through fifth signal frequencies, respectively. Additionally, the resonant circuits formed from inductors 88a-88e and capacitors 87a-87e can have a relatively low impedance at the first through fifth envelope signal frequencies, respectively, which can aid in reducing capacitive loading of the envelope tracker 30.

FIG. 8E is a schematic block diagram of a multi-band power amplifier system 120 in accordance with yet another embodiment. The illustrated power amplifier system 120 includes an envelope tracker 30, input stages 82a-82e, power amplifiers 32a-32e, a capacitor 83, an inductor 85, a first plurality of capacitors 121a, 121b, a second plurality of capacitors 84a-84e, a first plurality of inductors 122a-122d, a second plurality of inductors 86a-86e, impedance matching blocks 64a-64e, a front end module 12, and an antenna 14.

The power amplifier system 120 of FIG. 8E is similar to the power amplifier system 100 of FIG. 8C described above. However, in contrast to the power amplifier system 100 of FIG. 8C, the power amplifier system 120 of FIG. 8E includes a different arrangement of capacitors and inductors electrically connected between the supply voltage $V_{CC2}$ and the power supply nodes of the power amplifiers 32a-32e.

For example, the inductors 122a, 122b include a first end electrically connected to the supply voltage $V_{CC2}$ and a second end electrically connected to the collectors of the bipolar transistors 61a, 61b, respectively. However, rather than employing separate capacitors in parallel with each of the inductors 122a, 122b to form a pair of parallel LC circuits as in FIG. 10A, the illustrated power amplifier system 120 includes a capacitor 121a disposed between the collectors of the bipolar transistors 61a, 61b. The capacitor 121a and the inductor 122a can be configured to have a resonance near the first RF signal frequency, while the capacitor 121a and the inductor 122b can be configured to have a resonance near the second RF signal frequency. By providing resonances in this manner, the resonant LC circuit formed from the capacitor 121a and the inductors 122a, 122b can have a relatively large impedance at the first and second signal frequencies, which can aid in providing capacitance to the first and second power amplifiers 32a, 32b at the first and second signal frequencies, respectively. Furthermore, the resonant LC circuit can have a relatively low impedance at the envelope frequency of the first and second signals, thereby reducing the capacitive loading of the envelope tracker 30 relative to a design employing bypass capacitors to ground.

In certain implementations, the resonant LC circuit formed from the capacitor 121a and the inductors 122a, 122b can provide improved performance at harmonics of the signal frequency, such as at second and/or third harmonics of the signal frequency. For example, a resonant LC circuit formed from the capacitor 121a and the inductors 122a, 122b can have a relatively low impedance at twice the signal frequency and at three times the signal frequency, thereby providing improved harmonic termination for the power amplifier system.

As shown in FIG. 8E, the capacitor 121b and the inductors 122c, 122d have been configured to provide a resonant LC circuit for the power amplifiers 32c, 32d. For example, the inductors 122c, 122d each include a first end electrically connected to the supply voltage $V_{CC2}$ and a second end electrically connected to the collectors of the bipolar transistors 61c, 61d, respectively, and the capacitor 121b is electrically connected between the collectors of the bipolar transistors 61c, 61d. The capacitor 121b and the inductor 122c can be configured to have a resonance near the third RF signal frequency, and the capacitor 121b and the inductor 122d can be configured to have a resonance near the fourth RF signal frequency.

The power supply node of the power amplifier 32e has been electrically connected to the supply voltage $V_{CC2}$ using a different configuration than that used for power amplifiers 32a-32d. For example, in a manner similar to that described above with reference to FIG. 8A, the capacitor 83 and the inductor 85 have been electrically connected in parallel to form a parallel LC circuit disposed between power supply node of the power amplifier 32e and the supply voltage $V_{CC2}$. FIG. 8E illustrates that different resonant circuits can be employed to reduce capacitive load in a power amplifier system.

Figure 8F:
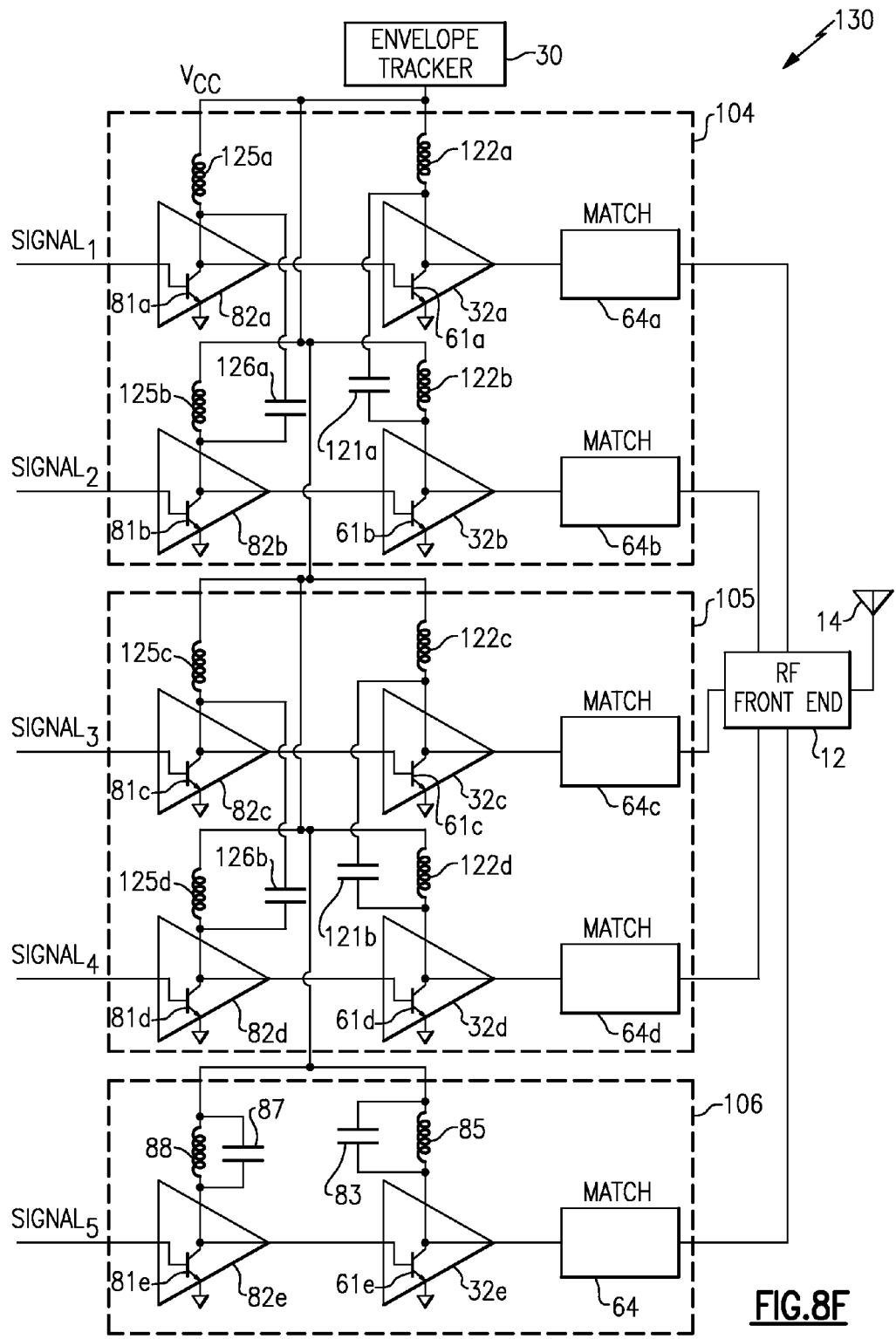
FIG. 8F is a schematic block diagram of a multi-band power amplifier system in accordance with still yet another embodiment.

FIG. 8F is a schematic block diagram of a multi-band power amplifier system 130 in accordance with still yet another embodiment. The illustrated power amplifier system 130 includes an envelope tracker 30, input stages 82a-82e, power amplifiers 32a-32e, a first capacitor 83, a first inductor 85, a second capacitor 87, a second inductor 88, a first plurality of capacitors 121a, 121b, a second plurality of capacitors 126a, 126b, a first plurality of inductors 122a-122d, a second plurality of inductors 125a-125d, impedance matching blocks 64a-64e, a front end module 12, and an antenna 14.

The power amplifier system 130 of FIG. 8F is similar to the power amplifier system 120 of FIG. 8E described above. However, in contrast to the power amplifier system 120 of FIG. 8E, in the power amplifier system 130 of FIG. 8F both the input stages 82a-82e and the power amplifiers 32a-32e are configured to receive a supply voltage $V_{CC}$ from the envelope tracker 30.

To aid in reducing the capacitive loading of the envelope tracker 30 when the envelope tracker 30 is configured to also provide a supply voltage to the input stages 82a-82e, various resonant circuits have been disposed between the input stages 82a-82e and the supply voltage $V_{CC}$. For example, the inductors 125a, 125b each include a first end electrically connected to the supply voltage $V_{CC}$ and a second end electrically connected to the collectors of the bipolar transistors 81a, 81b, respectively, and the capacitor 126a is electrically connected between the collectors of the bipolar transistors 81a, 81b. Similarly, the inductors 125c, 125d each include a first end electrically connected to the supply voltage $V_{CC}$ and a second end electrically connected to the collectors of the bipolar transistors 81a, 81b, respectively, and the capacitor 126b is electrically connected between the collectors of the bipolar transistors 81a, 81b. The inductor 88 and the capacitor 87 have been electrically connected in parallel and disposed between the collector of the bipolar transistor 81e and the supply voltage $V_{CC}$. Additional details of the power amplifier system 130 can be similar to those described earlier with respect to FIGS. 8A-8E.

Figure 9A:
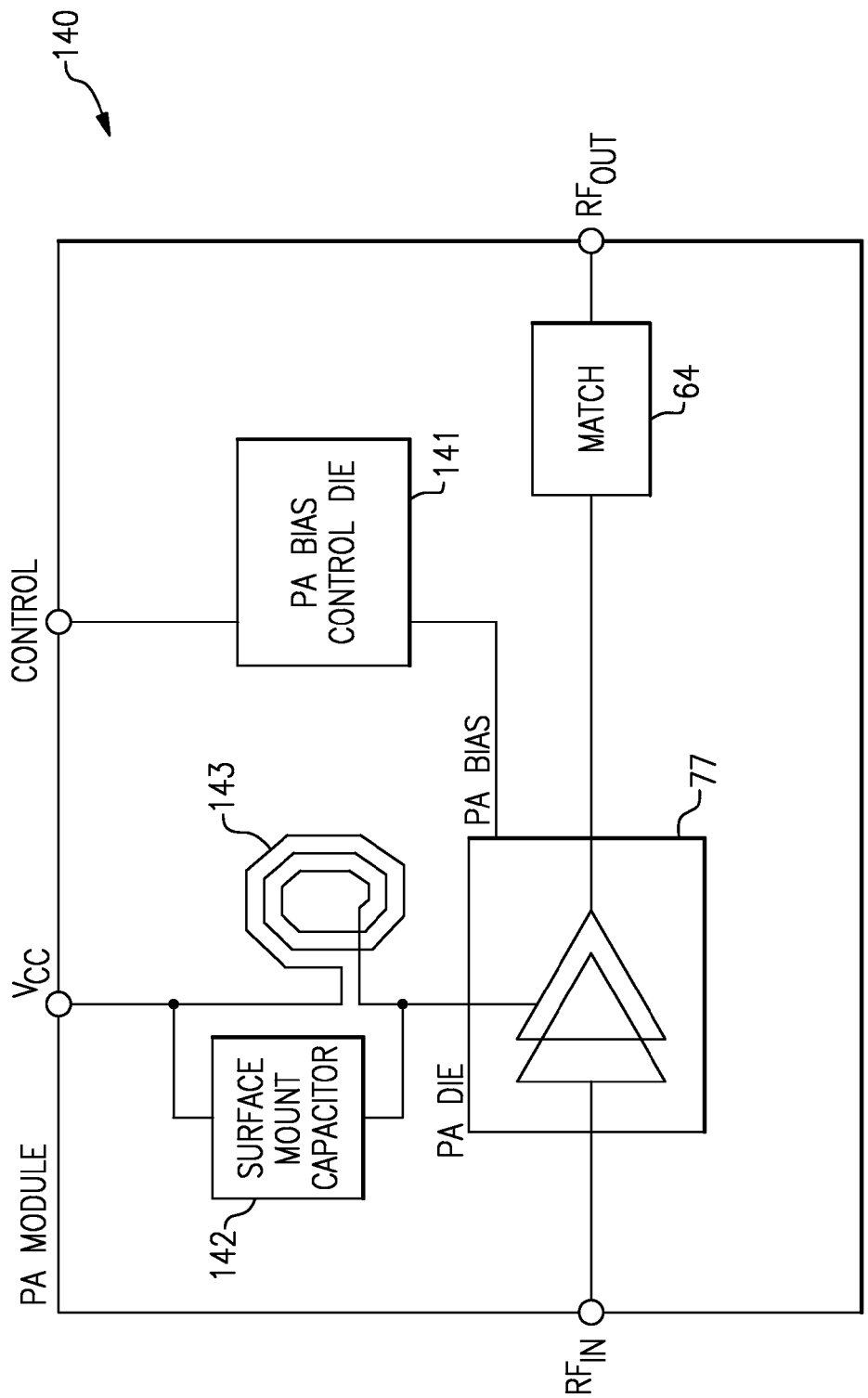
FIG. 9A is a schematic block diagram of a power amplifier module in accordance with one embodiment.

FIG. 9A is a schematic block diagram of a power amplifier module 140 in accordance with one embodiment. The illustrated power amplifier module 140 is a multi-chip module (MCM) that includes a bias control die 141, a power amplifier die 77, an inductor 143, a surface mount capacitor 142, and an impedance matching component 64. The power amplifier module 140 can include a plurality of dies and/or other components mounted on a carrier substrate of the module, which can be a multi-layer substrate configured to support the dies and components and to provide electrical connectivity to external circuitry when the module is mounted on a phone board.

The power amplifier die 77 can receive a RF signal on an input pin $RF_{IN}$ of the power amplifier module 140. The power amplifier die 77 can include one or more power amplifiers, including, for example, multi-stage power amplifiers configured to amplify the RF signal. The amplified RF signal can be provided to an output pin $RF_{OUT}$ of the power amplifier module 140. The impedance matching component 64 can be provided on the power amplifier module 140 to aid in reducing signal reflections. The power amplifier die 77 can be any suitable die. In one implementation, the power amplifier die 77 is a gallium arsenide (GaAs) die having transistors formed using a heterojunction bipolar transistor (HBT) process.

The power amplifier module 140 can also include a $V_{CC}$ pin, which can be electrically connected to an envelope tracking module on a phone board (see, for example, FIG. 7). The power amplifier module 140 can include the inductor 143, which can be formed, for example, by trace on the power amplifier module 140. The inductor 143 can operate as a choke inductor, and can be disposed between the supply voltage and the power amplifier die 77, as was described earlier. Additionally, the surface mount capacitor 142 can be electrically connected in parallel with the inductor 143 and can be configured to resonate at a frequency near the frequency of a signal received on the pin $RF_{IN}$.

The bias control die 141 can be used, for example, to provide bias signals to the power amplifier die 77. For example, in a bipolar transistor configuration, the bias control die 141 can be used to provide a reference voltage for biasing a current mirror used to generate a base current for the power amplifiers, such as a base current for the bipolar transistor 61 of FIG. 8A. The bias control die 141 can also be used to enable and/or disable a power amplifier disposed on the power amplifier die 77, which can aid in selectively activating a power amplifier associated with a particular transmission path. For example, the bias control die 141 can receive a control signal on a pin CONTROL, and can use the control signal to vary the bias signal provided to the power amplifier die 77 so as to selectively enable or disable the power amplifier.

The power amplifier module 140 can be modified to include more or fewer components, including, for example, additional power amplifier dies, capacitors and/or inductors. For instance, the power amplifier module 140 can include an additional power amplifier die, as well as an additional capacitor and inductor configured to operate as a parallel LC circuit disposed between the additional power amplifier die and the $V_{CC}$ pin of the module. Likewise, the power amplifier module 140 can include an additional power amplifier die and an additional inductor, and the power amplifier dies, inductors and the capacitor 142 can be electrically connected in a configuration similar to that shown for the module 105 of FIG. 8E. Persons having ordinary skill in the art will also appreciated that the power amplifier module 140 can be configured to have additional pins, such as in embodiments in which a separate power supply is provided to an input stage disposed on the power amplifier die 77 and/or implementations where the power amplifier module 140 operates over a plurality of bands.

Figure 9B:
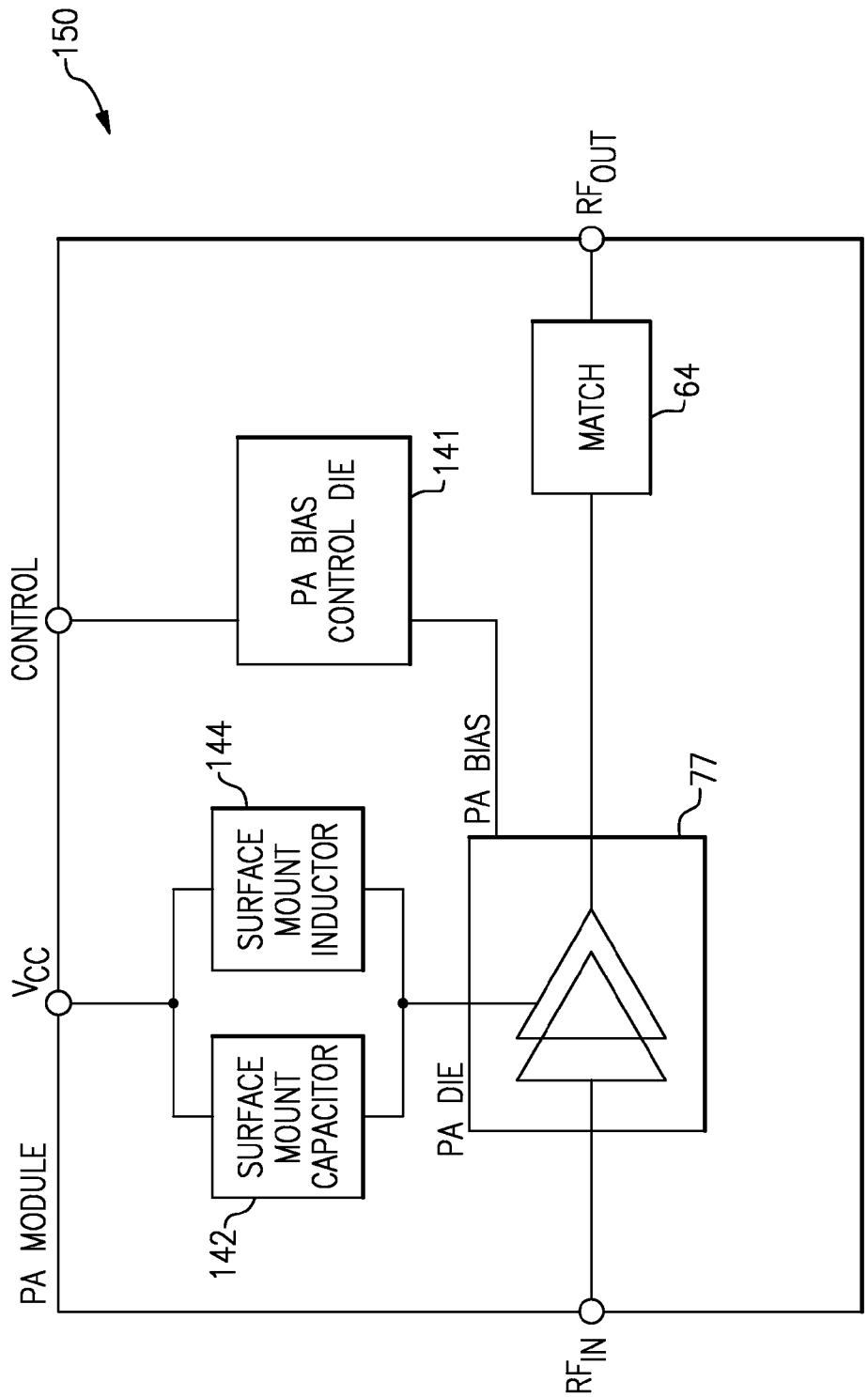
FIG. 9B is a schematic block diagram of a power amplifier module in accordance with another embodiment.

FIG. 9B is a schematic block diagram of a power amplifier module 150 in accordance with another embodiment. The illustrated power amplifier module 150 is a multi-chip module (MCM) that includes a bias control die 141, a power amplifier die 77, a surface mount inductor 144, a surface mount capacitor 142, and an impedance matching component 64.

The power amplifier module 150 of FIG. 9B is similar to the power amplifier module 140 of FIG. 9A. However, in contrast to the power amplifier module 140 of FIG. 9A, the power amplifier module 150 of FIG. 9B includes a surface mount inductor 144 rather than an inductor formed from trace disposed on the power amplifier module. FIG. 9B illustrates one of many variations of power amplifier modules utilizing the capacitive load reduction schemes described herein. For example, a variety of capacitive, inductive, matching, biasing, and/or amplifying components can be used in accordance with certain configurations. Additionally, certain components, such as the bias control die 141 and/or matching component 64 need not be included in some implementations.

Figure 10A:
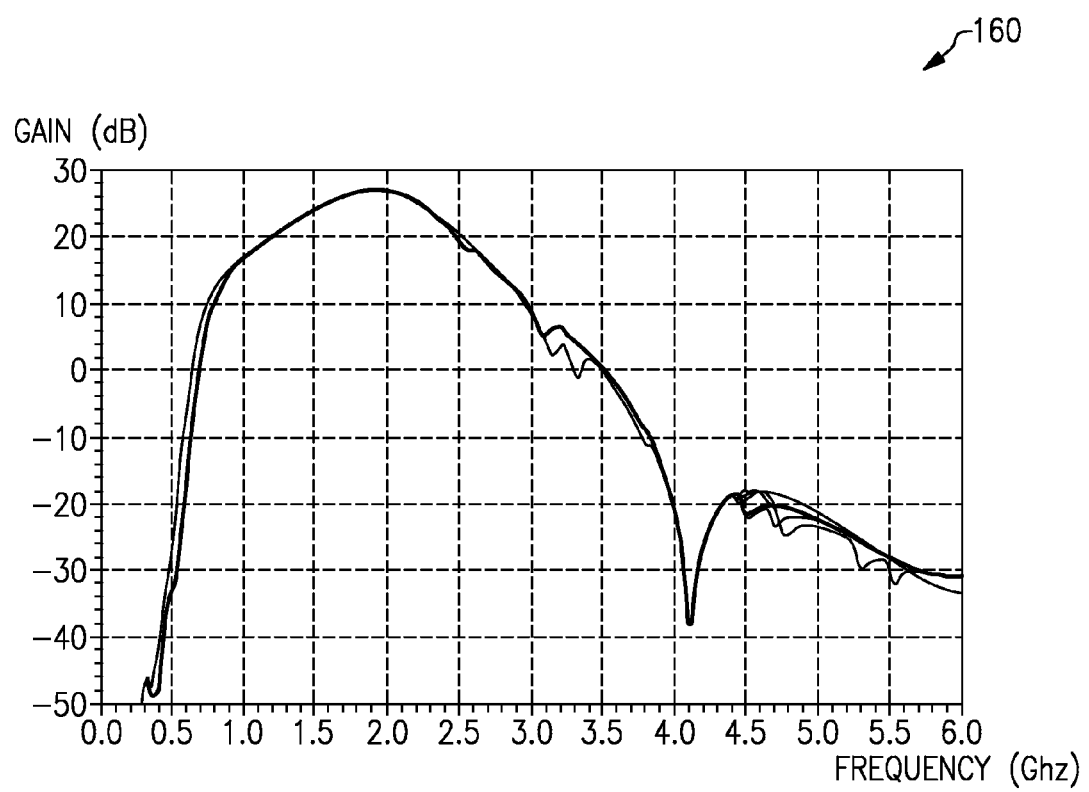
FIG. 10A is a graph of gain versus frequency for one implementation of a power amplifier system.

FIG. 10A is a graph 160 of gain versus frequency for one implementation of a power amplifier system. The power amplifier system includes five power amplifiers arranged in a configuration similar to that shown in FIG. 8C. The graph 160 includes a plurality of plots illustrating simulations of power amplifier gain versus frequency as board trace length is varied from 0 mm to 50 mm. The illustrate gain is for a power amplifier in the power amplifier system configured to amplify a Band I or W-CDMA 2100 signal.

Figure 10B:
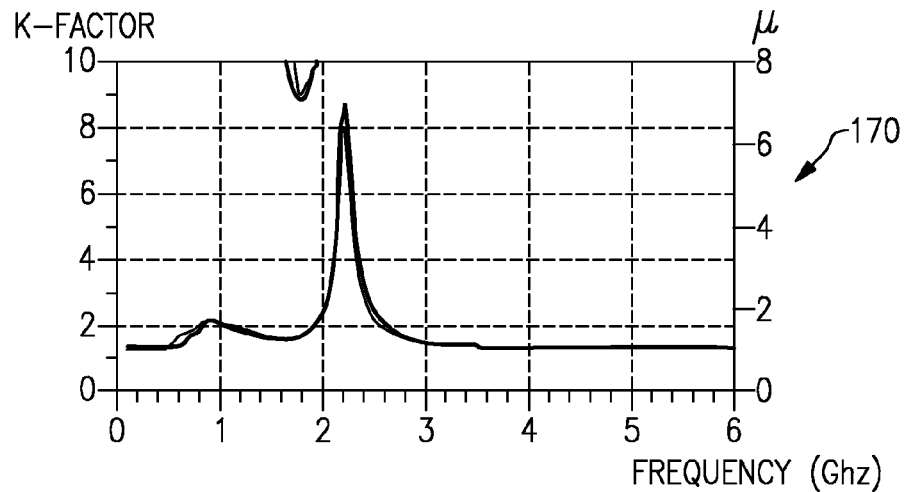
FIG. 10B is a graph of two stability factors versus frequency for one implementation of a power amplifier system.

FIG. 10B is a graph 170 of two stability factors versus frequency for one implementation of a power amplifier system. The power amplifier system includes five power amplifiers arranged in a configuration similar to that shown in FIG. 8C. The graph 170 includes a plurality of plots of k-factor and µ simulations versus frequency as board trace length is varied from 0 mm to 50 mm. The illustrated k-factor and µ plots are for a power amplifier in the power amplifier system configured to amplify a Band I or W-CDMA 2100 signal. As illustrated in FIG. 10B, the power amplifier is stable as trace length is varied.

Figure 10C:
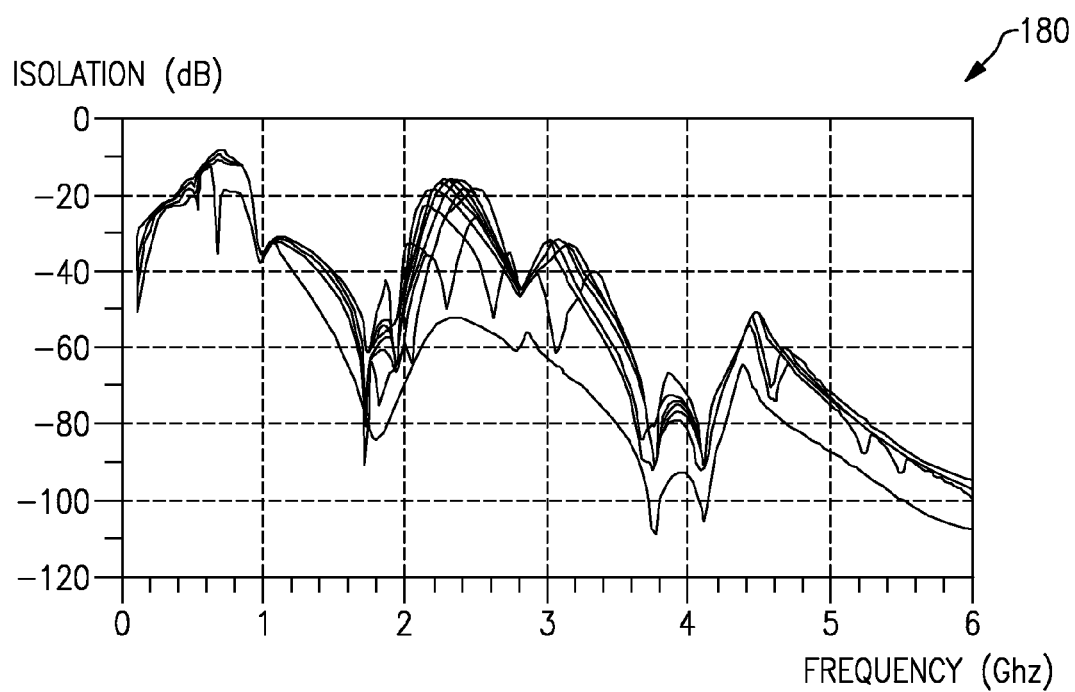
FIG. 10C is a graph of isolation versus frequency for one implementation of a power amplifier system.

FIG. 10C is a graph 180 of isolation versus frequency for one implementation of a power amplifier system. The power amplifier system includes five power amplifiers arranged in a configuration similar to that shown in FIG. 8C. The graph 180 includes a plurality of plots illustrating band-to-band noise simulations versus frequency as board trace length is varied from 0 mm to 50 mm. The graph 180 illustrates noise received at a disabled Band I or W-CDMA 2100 power amplifier when operating a Band IV or W-CDMA 1700 power amplifier. As illustrated in FIG. 10C, the power amplifier system exhibits relatively good band-to-band isolation, even when using an envelope tracker to provide a power supply voltage to a plurality of power amplifiers operating over different frequency bands.

Figure 11:
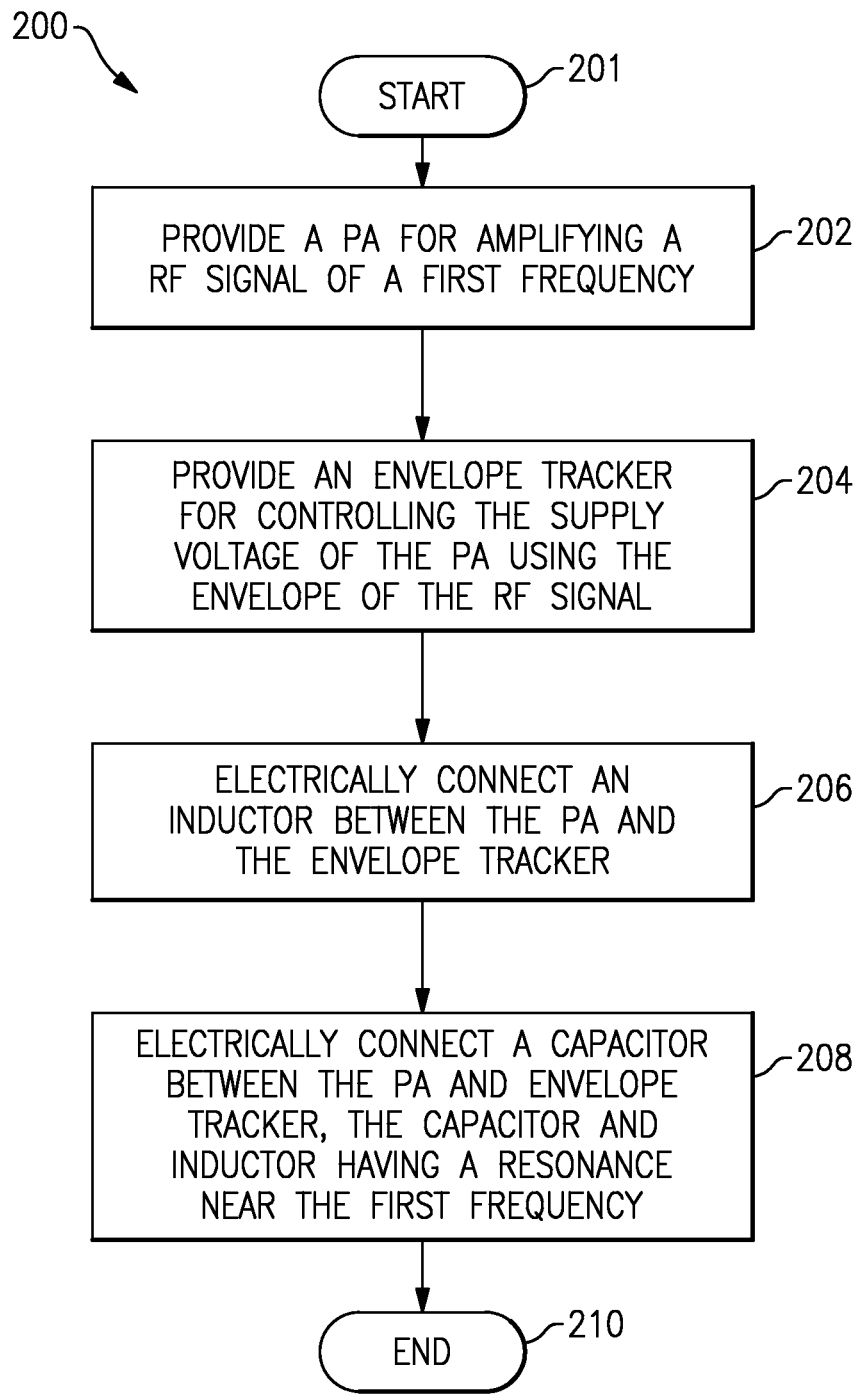
FIG. 11 is a flow chart illustrating a method for reducing load capacitance of an envelope tracker in accordance with one embodiment.

FIG. 11 is a flow chart illustrating a method 200 for reducing load capacitance of an envelope tracker in accordance with one embodiment. It will be understood that the method can include greater or fewer operations and the operations may be performed in any order, as necessary.

The method 200 starts at 201. In an ensuing block 202, a power amplifier is provided for amplifying a RF signal of a first frequency. For example, a power amplifier can be provided for amplifying a W-CDMA signal having a frequency content centered around the first frequency.

In an ensuing block 204, an envelope tracker is provided for controlling the supply voltage of the power amplifier using the envelope of the RF signal. For example, the envelope tracker can be electrically connected to a battery, and can change a voltage provided to the power amplifier using an envelope received from a transmitter.

The method 200 continues at a block 206, in which an inductor is electrically connected between the power amplifier and the envelope tracker. In a block 208, a capacitor is electrically connected between the power amplifier and the envelope tracker, and the capacitor and inductor are configured to have a resonance near the first frequency. By providing a resonant circuit having an inductor and a capacitor, such as a parallel LC circuit tuned to the first frequency, the capacitive loading of the power amplifier on the envelope tracker can be reduced. For example, the resonant circuit including the capacitor and inductor can have a relatively high impedance at the first frequency, such that the capacitor operates as a supply or bypass capacitor for the power amplifier at the first frequency. Providing supply capacitance to the power amplifier can improve the performance and/or stability of the power amplifier. However, the resonant circuit including the inductor and capacitor can have a relatively low impedance at the envelope frequency of the signal, such that the resonant circuit provides a relatively small load to the envelope tracker. Additional details of the resonant circuit can be as described above with reference to FIGS. 8A-9B. The method ends at 210.

Although certain implementations described herein are illustrated as not including bypass capacitors for a supply voltage generated by an envelope tracker, both a resonant circuit and a bypass capacitor can be provided in certain embodiments. For example, a parallel LC circuit or other resonant circuit can be disposed between a power amplifier and an envelope tracker, and a relatively small bypass capacitor can be provided between ground and the power amplifier's supply.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier module comprising:
a power supply input configured to receive a supply voltage from an envelope tracking module;
a first power amplifier die including a first supply input configured to receive the supply voltage, the first power amplifier die configured to amplify at least a first RF signal, the first RF signal having a first center frequency and an envelope of the first RF signal having a first envelope frequency;
a second power amplifier die including a second supply input configured to receive the supply voltage, the second power amplifier die configured to amplify at least a second RF signal;
a first inductor and a first capacitor electrically connected in parallel, the first inductor and the first capacitor electrically connected between the power supply input and the first supply input of the first power amplifier die, the first inductor and the first capacitor having a resonance near the first center frequency such that an impedance of the first inductor and the first capacitor is greater at the first center frequency than at the first envelope frequency to reduce capacitive loading of the envelope tracking module; and
a second inductor and a second capacitor electrically connected in parallel, the second inductor and the second capacitor electrically connected between the power supply input and the second supply input of the second power amplifier die.

2. The power amplifier module of claim 1 wherein the second RF signal has a second center frequency and an envelope of the second RF signal has a second envelope frequency, the second capacitor and the second inductor having a resonance near the second center frequency such that an impedance of the second inductor and the second capacitor is greater at the second center frequency than at the second envelope frequency.

3. The power amplifier module of claim 1 wherein the first inductor includes a surface mount inductor and the first capacitor includes a surface mount capacitor.

4. The power amplifier module of claim 1 wherein the first inductor includes a spiral inductor associated with a carrier substrate of the power amplifier module, and the first capacitor includes a surface mount capacitor.

5. The power amplifier module of claim 1 wherein the first power amplifier die includes an input stage including a first bipolar transistor and a power amplifier including a second bipolar transistor, the first and second bipolar transistors configured to provide amplification to the first RF signal, the first inductor and the first capacitor electrically connected between the power supply input and a collector of the second bipolar transistor.

6. The power amplifier module of claim 5 further comprising a third inductor and a third capacitor electrically connected in parallel, the third inductor and the third capacitor electrically connected between the power supply input and a collector of the first bipolar transistor.

7. A mobile device comprising:
a phone board;
a first power amplifier module disposed on the phone board and including a first supply input configured to receive a supply voltage, the first power amplifier module configured to amplify at least a first radio frequency (RF) signal, the first RF signal having a first center frequency and an envelope of the first RF signal having a first envelope frequency;
a second power amplifier module disposed on the phone board and including a second supply input configured to receive the supply voltage, the second power amplifier module configured to amplify at least a second RF signal;
an envelope tracking module disposed on the phone board and including a supply output configured to generate the supply voltage, the envelope tracking module configured to control a voltage level of the supply voltage;
a first inductor and a first capacitor electrically connected in parallel, the first inductor and the first capacitor electrically connected between the supply output of the envelope tracking module and the first supply input of the first power amplifier module, the first inductor and the first capacitor having a resonance near the first center frequency such that an impedance of the first inductor and the first capacitor is greater at the first center frequency than at the first envelope frequency to reduce capacitive loading of the envelope tracking module; and
a second inductor and a second capacitor electrically connected in parallel, the second inductor and the second capacitor electrically connected between the supply output of the envelope tracking module and the second supply input of the second power amplifier module.

8. The mobile device of claim 7 wherein the envelope tracking module is configured to control the voltage level of the supply voltage based at least on the envelope of the first RF signal and on an envelope of the second RF signal.

9. The mobile device of claim 7 wherein the second RF signal has a second center frequency and an envelope of the second RF signal has a second envelope frequency, the second capacitor and the second inductor have a resonance near the second center frequency such that an impedance of the second inductor and the second capacitor is greater at the second center frequency than at the second envelope frequency.

10. The mobile device of claim 9 wherein an impedance of the first capacitor and the first inductor is greater than about 200 Ω over a transmission band of the first RF signal.

11. The mobile device of claim 7 further comprising:
a third power amplifier module disposed on the phone board and including a third supply input configured to receive the supply voltage, the third power amplifier module configured to amplify at least a third RF signal; and
a third inductor and a third capacitor electrically connected in parallel, the third inductor and the third capacitor electrically connected between the supply output of the envelope tracking module and the third supply input of the third power amplifier module.

12. The mobile device of claim 11 wherein the first RF signal includes a Band I signal or a Band II signal, the second RF signal includes a Band V signal or a Band VIII signal, and the third RF signal includes a Band IV signal.

13. The mobile device of claim 7 wherein the first inductor includes a surface mount inductor of the first power amplifier module, and the first capacitor includes a surface mount capacitor of the first power amplifier module.

14. The mobile device of claim 7 wherein the first inductor includes a spiral inductor of the first power amplifier module, and the first capacitor includes a surface mount capacitor of the first power amplifier module.

15. The mobile device of claim 7 further comprising an RF front end module disposed on the phone board, the RF front end module configured to generate a multiplexed signal based on multiplexing a plurality of RF signals including the first RF signal and the second RF signal.

16. The mobile device of claim 15 further comprising an antenna configured to receive the multiplexed signal.

17. A method of power supply control in a power amplifier system, the method comprising:
controlling a voltage level of a supply voltage using an envelope tracking module;
amplifying a first RF signal using a first power amplifier module, the first RF signal having a first center frequency and an envelope of the first RF signal having a first envelope frequency;
amplifying a second RF signal using a second power amplifier module;
delivering the supply voltage to a first supply input of the first power amplifier module through a first resonant circuit, the first resonant circuit including a first inductor and a first capacitor electrically connected in parallel;
resonating the first resonant circuit near the first center frequency such that an impedance of the first resonant circuit is greater at the first center frequency than at the first envelope frequency to reduce capacitive loading of the envelope tracking module; and
delivering the supply voltage to a second supply input of the second power amplifier module through a second resonant circuit, the second resonant circuit including a second inductor and a second capacitor electrically connected in parallel.

18. The method of claim 17 wherein controlling the voltage level of the supply voltage includes controlling the voltage level of the supply voltage based at least on the envelope of the first RF signal and on an envelope of the second RF signal.

19. The method of claim 17 wherein the second RF signal has a second center frequency and an envelope of the second RF signal has a second envelope frequency, the method further comprising resonating the second resonant circuit near the second center frequency such that an impedance of the second resonant circuit is greater at the second center frequency than at the second envelope frequency.

* * * * *